(12) United States Patent
Jeong

(10) Patent No.: US 6,949,177 B2
(45) Date of Patent: Sep. 27, 2005

(54) SYSTEM AND METHOD FOR PROCESSING SEMICONDUCTOR WAFERS USING DIFFERENT WAFER PROCESSES

(75) Inventor: In Kwon Jeong, Cupertino, CA (US)

(73) Assignee: Oriol Inc., Santa Clara, CA (US)

( * ) Notice: Subject to any disclaimer, the term of this patent is extended or adjusted under 35 U.S.C. 154(b) by 507 days.

(21) Appl. No.: 09/931,695

(22) Filed: Aug. 16, 2001

(65) Prior Publication Data

US 2003/0217811 A1 Nov. 27, 2003

(51) Int. Cl.$^7$ .............................................. B24B 7/00
(52) U.S. Cl. ........................ 205/80; 204/198; 204/199; 204/212; 204/224 R
(58) Field of Search ................... 204/198, 199, 204/212, 224 R; 205/80

(56) References Cited

U.S. PATENT DOCUMENTS

| 5,667,592 | A | | 9/1997 | Boitnott et al. |
| 6,096,162 | A | | 8/2000 | Lin et al. |
| 6,629,883 | B2 | * | 10/2003 | Katsuoka et al. ........... 451/332 |

FOREIGN PATENT DOCUMENTS

WO    WO 9926763 A2  *  6/1999  ....... B24B/37/0413

* cited by examiner

Primary Examiner—Arun S. Phasge
(74) Attorney, Agent, or Firm—McKenna Long & Aldridge LLP

(57) ABSTRACT

A system and method for processing semiconductor wafers using different wafer processes utilizes multiple processing assemblies to efficiently perform these wafer processes. The wafer processes performed by the processing assemblies may vary with respect to operating parameters or the types of wafer processes, which allows customization of the wafer processes. Each of the processing assemblies is configured to sequentially process two or more semiconductor wafers at different processing positions by sequentially transferring the semiconductor wafers to the different processing positions using a wafer transfer carousel. As the semiconductor wafers are processes at one of the processing assemblies, the processed semiconductor wafers are sequentially transferred to the next processing assembly in an efficient manner. The sequential processing of the semiconductor wafers at each of the processing assemblies and the sequential transferring of the wafers contribute to an increased throughput.

30 Claims, 15 Drawing Sheets

SYSTEM AND METHOD FOR PROCESSING SEMICONDUCTOR WAFERS USING DIFFERENT WAFER PROCESSES

FIELD OF THE INVENTION

The invention relates generally to semiconductor wafer processing, and more particularly to a system and method for processing semiconductor wafers using different wafer processes.

BACKGROUND OF THE INVENTION

During fabrication of a semiconductor device, various processes are performed on a semiconductor wafer to form microelectronic components on the wafer. The processes may include chemical mechanical polishing (CMP), electroplating, and wet etching, as well as other conventional semiconductor processes. Each of these processes may be performed by individual processing equipment. Consequently, many pieces of processing equipment may be needed to fabricate semiconductor devices.

CMP equipment operates to planarize a layer of a semiconductor wafer by chemically and mechanically removing uneven topographic features of the wafer. A conventional CMP technique involves polishing the surface of a semiconductor wafer with a rotating polishing pad using a slurry of colloidal particles in an aqueous solution. The slurry promotes planarization of the wafer surface by producing a chemical reaction with the wafer surface and by providing abrasives to "grind" the wafer surface with the polishing pad. In certain applications, the polished semiconductor wafer may need to be further polished using a slurry with finer abrasives. Thus, in these applications, a second piece of CMP equipment needed to further polish the polished semiconductor wafer.

Electroplating equipment operates to deposit a metal layer onto a semiconductor wafer by electrolysis. With typical electroplating equipment, a target semiconductor wafer is immersed in a bath of plating solution or an aqueous metal acid solution, which includes a counter electrode. When the target semiconductor wafer is negatively charged and the counter electrode is positively charged, the positively charged metal ions in the plating solution are attracted to the cathode, i.e., the negatively charged wafer, and the ions are deposited on the wafer as a metal film.

Wet etching equipment operates to selectively remove materials from a semiconductor wafer. Wet etching may involve immersing a semiconductor wafer into a bath of chemical etchant, which dissolves unwanted materials from the wafer. Alternatively, the chemical etchant can be applied to the surface of a semiconductor wafer by spraying the etchant onto the wafer. Wet etching is typically used to remove exposed areas a semiconductor wafer that are not protected by a masking layer.

For fabrication of certain semiconductor devices, two or more pieces of the above-identified processing equipment may be needed to sequentially process semiconductor wafers. Since each piece of equipment may require a substantial amount of valuable real estate in a cleanroom, the total amount of space occupied by the equipment can be significant. Furthermore, since each piece of processing equipment may have different throughputs, the semiconductor wafers being processed may encounter congestion at one or more pieces of processing equipments.

In view of the above concerns, there is a need for a system and method for processing semiconductor wafers using different semiconductor processes so that the amount of space required in a cleanroom is reduced and congestion at one or more semiconductor processing stations of the system is eased or eliminated.

SUMMARY OF THE INVENTION

A system and method for processing semiconductor wafers using different wafer processes utilizes multiple processing assemblies to efficiently perform these wafer processes. The wafer processes performed by the processing assemblies may vary with respect to operating parameters or the types of wafer processes, which allows customization of the wafer processes. Each of the processing assemblies is configured to sequentially process two or more semiconductor wafers at different processing positions by sequentially transferring the semiconductor wafers to the different processing positions using a wafer transfer carousel. As the semiconductor wafers are processed at one of the processing assemblies, the processed semiconductor wafers are sequentially transferred to the next processing assembly in an efficient manner. The sequential processing of the semiconductor wafers at each of the processing assemblies and the sequential transferring of the wafers contribute to an increased throughput.

A system in accordance with the invention includes a number of wafer processing assemblies. Each of the wafer processing assemblies includes a wafer transfer carousel and a processing unit. The wafer transfer carousel has a number of wafer carriers that are each configured to hold a semiconductor wafer. The wafer transfer carousel is configured to move the wafer carriers in a substantially circular path to transfer the semiconductor wafers to different processing positions. The processing unit is configured to process the semiconductor wafers at the different processing positions. The system further includes at least one wafer transfer robot situated between two wafer processing assemblies to transfer the semiconductor wafers between the two wafer processing assemblies.

In an embodiment, the system further includes a second wafer transfer robot situated between two selected wafer processing assemblies to transfer the semiconductor wafers between the two selected wafer processing assemblies. In this embodiment, the two wafer transfer robots may be situated on opposite sides of the system.

In the embodiment, th processing unit is configured to perform at least one of the following semiconductor processes: polishing, wet etching, electroplating, cleaning, thickness measuring, heating, coating and treating.

In an embodiment, the processing unit of one of the wafer processing assemblies includes a number of sub-processing units to process some of the semiconductor wafers. In this embodiment, at least one of the sub-processing units may be configured to perform one of the following semiconductor processes: polishing, wet etching, electroplating, cleaning, thickness measuring, heating, coating and treating. Also in this embodiment, at least one of the sub-processing units may be configured to process one of the semiconductor wafers when that semiconductor wafer is placed on the sub-processing unit with the surface to be processed facing away from the sub-processing unit. Furthermore, in this embodiment, at least one of the sub-processing units may be is configured to process one of the semiconductor wafers held by one of the wafer carriers associated with the sub-processing units.

In an embodiment, the system further includes a wafer processing station to process the semiconductor wafers placed on the wafer processing station. The wafer processing station may be configured to process two or more of the semiconductor wafers in parallel. In this embodiment, the wafer processing station may be configured to perform cleaning and/or thickness measuring.

A method of processing semiconductor wafers in accordance with the invention includes the steps of processing the semiconductor wafers at processing positions of a first wafer processing assembly, transferring the semiconductor wafers that have been processed by the first wafer processing assembly to a second wafer processing assembly, and processing the semiconductor wafers at processing positions of the second wafer processing assembly. The step of processing the semiconductor wafers at the processing positions of the first wafer processing assembly includes moving the semiconductor wafers to the processing positions of the first wafer object processing assembly using a first wafer transfer carousel of the first wafer processing assembly in which the semiconductor wafers are supported by the first wafer transfer carousel. Similarly, the step of processing the semiconductor wafers at the processing positions of the second wafer processing assembly includes moving the semiconductor wafers to the processing positions of the second wafer processing assembly using a second wafer transfer carousel of the second wafer processing assembly in which the semiconductor wafers are supported by the second wafer transfer carousel.

In an embodiment, the step of moving the semiconductor wafers to the processing positions of the first wafer processing assembly includes rotating the first wafer carousel to move the semiconductor wafers to the processing positions of the first wafer processing assembly.

In an embodiment, at least one of the step of processing the semiconductor wafers at the processing positions of the first wafer processing assembly and the step of processing the semiconductor wafers at the processing positions of the second wafer processing assembly includes performing at least one of the following semiconductor processes: polishing, wet etching, electroplating, cleaning, thickness measuring, heating, coating and treating.

In an embodiment, the method further includes a step of transferring the semiconductor wafers that have been processed by the second wafer processing assembly to a third wafer processing assembly. This step includes unloading the semiconductor wafers from the second wafer processing assembly at a different processing position of the second wafer processing assembly from the processing position at which the semiconductor wafers were loaded onto the second wafer processing assembly.

In an embodiment, at least one of the step of processing the semiconductor wafers at the processing positions of the first wafer processing assembly and the step of processing the semiconductor wafers at the processing positions of the second wafer processing assembly includes processing the semiconductor wafers at sub-processing units. This step of processing the semiconductor wafers at the sub-processing units may include performing at least one of the following semiconductor processes: polishing, wet tching, electroplating, cleaning, thickness measuring, heating, coating and tr ating at one or more of said sub-processing units. In this embodiment, the method may further include a step of placing one of the semiconductor wafers on one of the sub-processing units, including turning over that semiconductor wafer such that the surface to be processed is faced away from that sub-processing unit. Also in this embodiment, the step of processing the semiconductor wafers at the sub-processing units may include holding one of the semiconductor wafers while processing that semiconductor wafer at one of the sub-processing units.

In an embodiment, the method further includes a step of transferring the semiconductor wafers that have been processed by said first wafer processing assembly to a wafer processing station to process the semiconductor wafers at the wafer processing station. The step of transferring the semiconductor wafers to the wafer processing station may include placing two of more of the semiconductor wafers on the wafer processing station to process the two or more semiconductor wafers in parallel. The step of transferring the semiconductor wafers to the wafer processing station may include cleaning and/or thickness measuring.

Other aspects and advantages of the present invention will become apparent from the following detailed description, taken in conjunction with the accompanying drawings, illustrated by way of example of the principles of the invention.

DETAILED DESCRIPTION OF THE INVENTION

Figure 1:
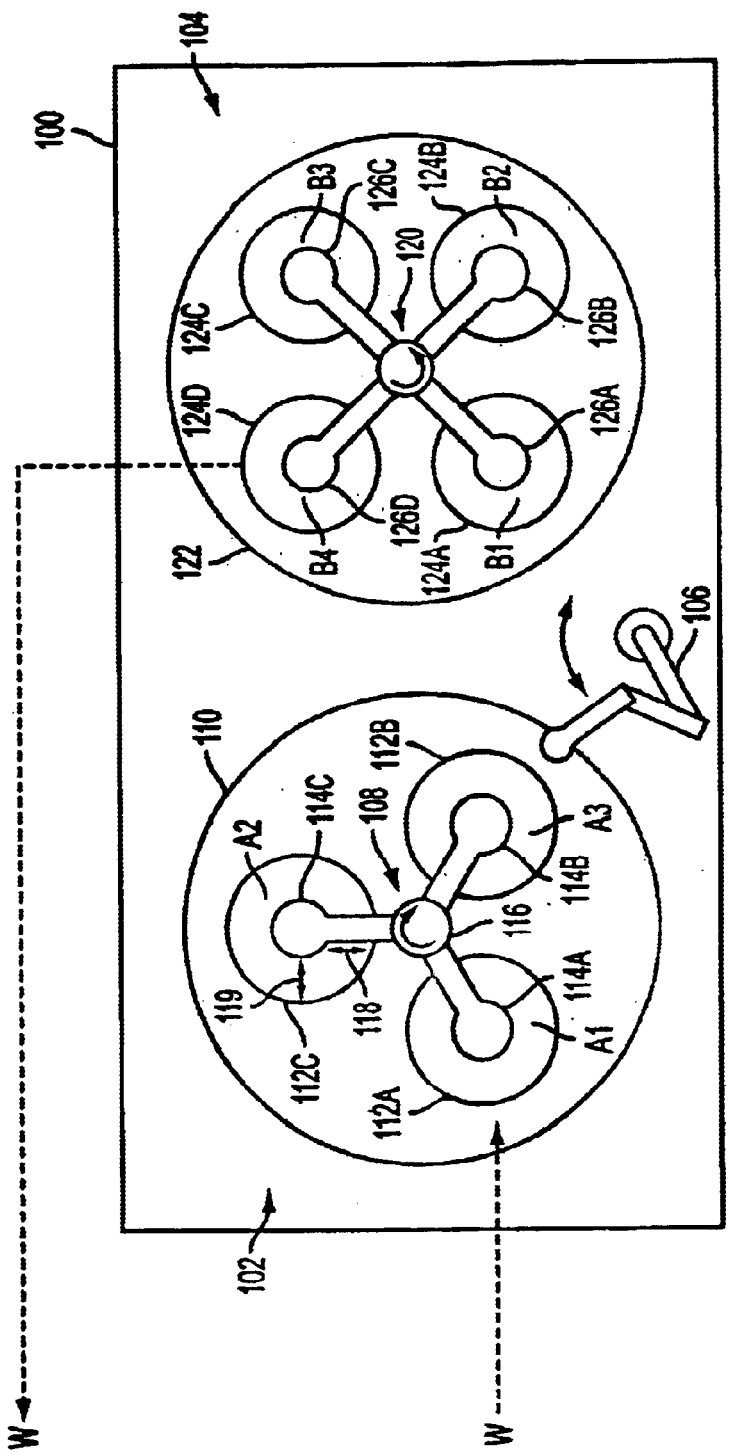
FIG. 1 is a plan view of a semiconductor processing system in accordance with a first embodiment of the present invention.

With reference to FIG. 1, a semiconductor processing system 100 in accordance with a first embodiment of the invention is shown. The system includes two processing assemblies 102 and 104, and a wafr transfer robot 106. The processing assemblies are each designed to process multiple semiconductor wafers. Each processing assembly may be configured to perform one of several semiconductor processes. The processing assemblies may be configured to perform the same semiconductor process, such as chemical mechanical polishing (CMP). However, the semiconductor process performed by the processing assembly 102 may differ from the semiconductor process performed by the processing assembly 104 in that the two semiconductor assemblies may perform the common semiconductor process using different operating parameters. For example, if the common semiconductor process is CMP, then the processing assembly 102 may use a different slurry or solution than the processing assembly 104. Alternatively, the processing assemblies may be configured to perform different types of semiconductor processes. For example, the processing assembly 102 may perform CMP and the processing assembly 104 may perform wet etching. In either case, the semiconductor system is designed to efficiently process semiconductor wafers at both of processing assemblies without significant idle periods during the semiconductor processes at the processing assemblies and during transfer between the processing assemblies.

Figure 2:
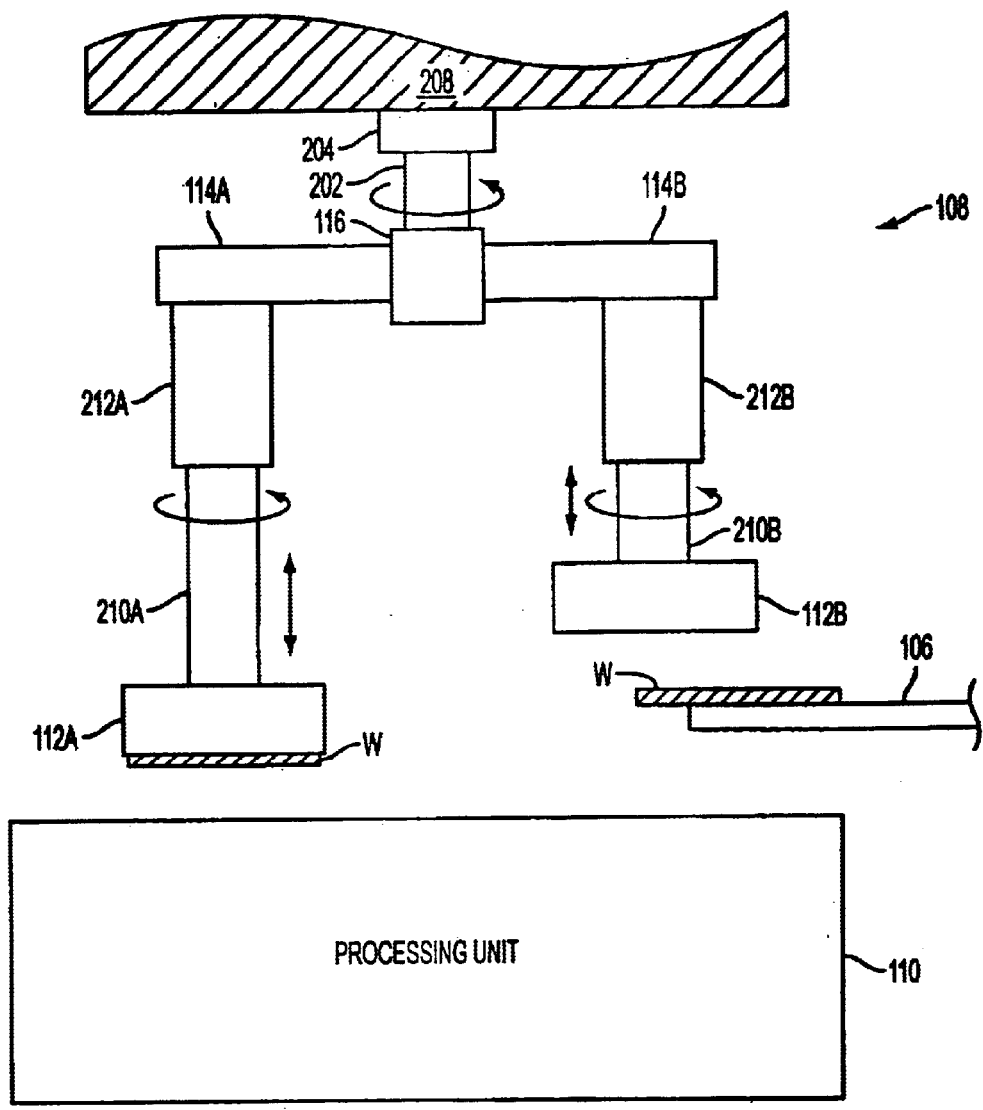
FIG. 2 is a side view of a processing assembly of the system of FIG. 1.

The processing assembly 102 of the semiconductor processing system 100 includes a wafer transfer carousel 108 and a processing unit 110. As shown in FIG. 2, the wafer transfer carousel is positioned above the processing unit. The wafer transfer carousel includes three wafer carriers 112A, 112B and 112C, as illustrated in FIG. 1, which can each hold a semiconductor wafer. Thus, the wafer transfer carousel can accommodate three semiconductor wafers at a time. The wafer transfer carousel further includes three carrier positioning arms 114A, 114B and 114C, which are connected to each other at a center connector 116. The central connector is coupled to a central shaft 202, which is connected to a rotational drive mechanism 204, as illustrated in FIG. 2. The rotational drive mechanism is affixed to an upper surface 208, which may be the housing of the semiconductor processing system. Each of the three wafer carriers 112A, 112B and 112C is connected to one of the carrier positioning arms 114A, 114B and 114C by a carrier shaft 210A, 210B and 210C (not shown) and a rotational-and-vertical drive mechanism 212A, 212B and 212C (not shown), as illustrated in FIG. 2. In FIG. 2, only the carrier shafts 210A and 210B and the rotational-and-vertical drive mechanisms 212A and 212B, which are connected to the wafer carriers 112A and 112B, are shown.

The rotational drive mechanism 204 operates to rotate the three carrier positioning arms 114A, 114B and 114C in a clockwise direction. Thus, each wafer carrier of the wafer transfer carousel 108 can be rotated to any one of the processing positions A1, A2 and A3 of the processing assembly 102, which are shown in FIG. 1. The rotational-and-vertical drive mechanisms 212A, 212B and 212C operated to independently rotate the connected wafer carriers 112A, 112B and 112C. Furthermore, the rotational-and-vertical drive mechanisms operate to independently raise and lower the connected wafer carriers, so that semiconductor wafers W on the wafer carriers can be selectively lowered to engage the processing unit 110.

In an alternative configuration, the central connector 116 includes an arm control mechanism (not shown) to selectively move the carrier positioning arms 114A, 114B and 114C. The arm control mechanism may be configured to extend and retract each of carrier positioning arms, as illustrated by the arrow 118 in FIG. 1, Furthermore, the arm control mechanism may be configured to oscillate each carrier positioning arm about the central connector, as illustrated by the arrow 119 in FIG. 1. Although the wafer transfer carousel 108 is illustrated and described as being a carousel that can accommodate three semiconductor wafers, the wafer transfer carousel may alternatively be configured to accommodate two to eight or more semiconductor wafers. For example, if the wafer transfer carousel is configured to accommodate five semiconductor wafers, then the wafer transfer carousel would include five wafer carriers that are connected to five carrier positioning arms.

The processing unit 110 of the processing assembly 102 may be a chemical mechanical polishing (CMP) unit, a wet etching unit, an electroplating unit, a wafer cleaning unit, an optical thickness measurement unit, a wafer heating unit, a wafer coating/treating unit, or any other conventional semiconductor processing unit that can operate on semiconductor wafers that are held by wafer carriers. The type of semiconductor process performed by the processing assembly 102 depends on the processing unit 110. Thus, depending on the processing unit 110, the processing assembly 102 may polish semiconductor wafers to planarize the wafers, wet etch the wafers, electroplate metal layers onto the wafers, clean the wafers, measure the thickness of surface features on the wafers, heat the wafers, coat the wafers with an appropriate coating material, treat the wafers with an appropriate wafer treating material, or perform other compatible semiconductor processes.

Figure 3:
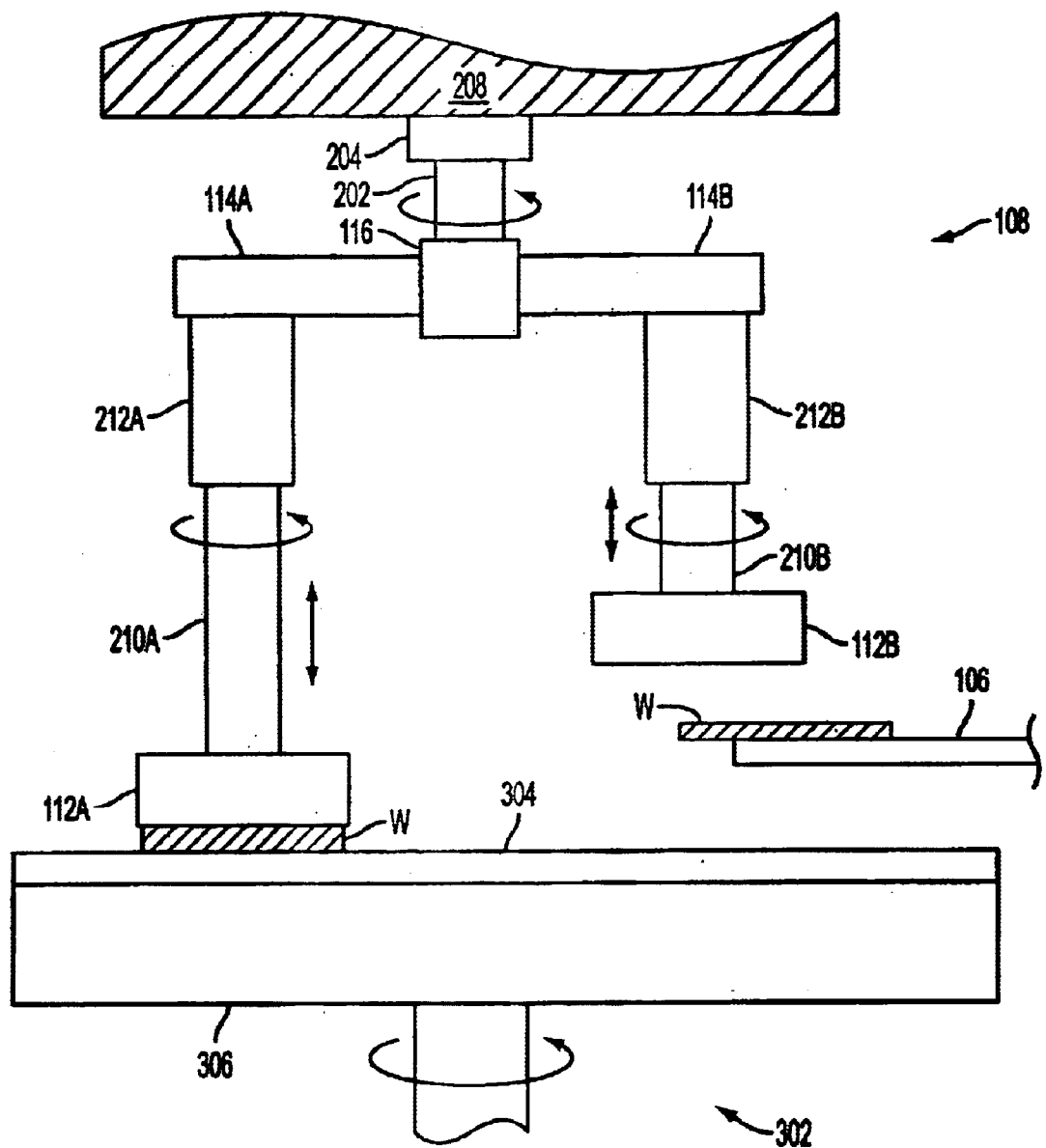
FIG. 3 illustrates an exemplary chemical mechanical polishing (CMP) unit that may be included in the processing assembly of FIG. 2.

In FIG. 3, an exemplary CMP unit 302 that may be included in the processing assembly 102 is shown. The CMP unit includes a polishing pad 304 that is attached to a rotatable base 306. The polishing pad may be of the type that contains abrasive particles on the pad surface. However, the polishing pad may be any type of polishing pad that is commonly used for CMP. In operation, slurry is supplied to the surface of the polishing pad through a nozzle (not shown) above the polishing pad. One or more semiconductor wafers W are then pressed against the polishing pad, which begins the polishing process. The polishing pad and the semiconductor wafers are rotated during the polishing process.

Figure 4:
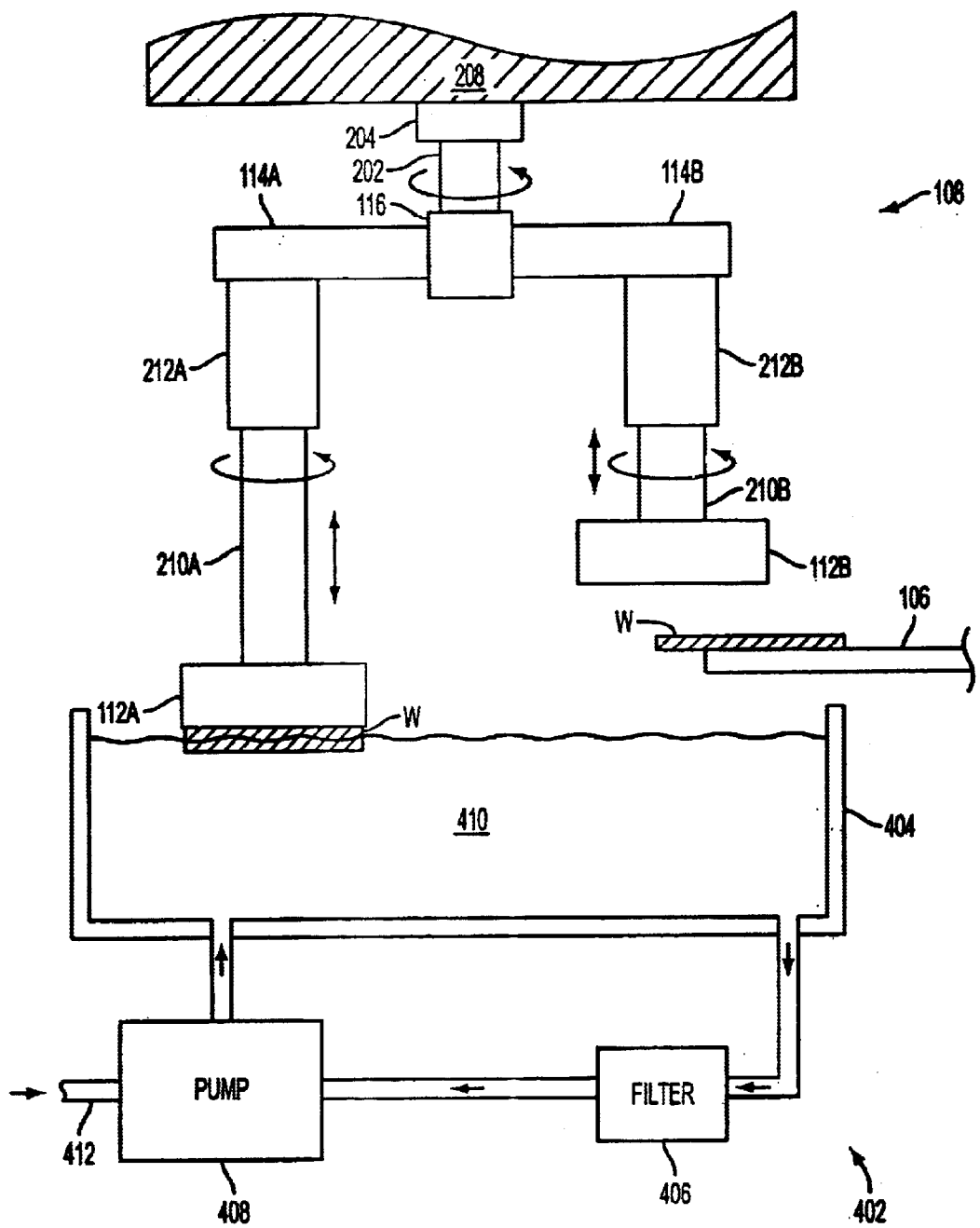
FIG. 4 illustrates an exemplary wet etching unit that may be included in the processing assembly of FIG. 2.

In FIG. 4, an exemplary wet etching unit 402 that may be included in the processing assembly 102 is shown. The wet etching unit includes a bath 404, a filter 406 and a pump 408. The bath contains the chemical etchant 410 that is used for wet etching. The chemical etchant can be any known type of chemical etchant, such as a solution with $H_2O_2$, $H_3PO_4$, $HNO_3$, $H_2SO_4$ or HF. The chemical etchant is supplied to the bath through a channel 412 to the pump 408, which relays the chemical etchant 410 to the bath 404. In addition, the pump receives recycled chemical etchant from the filter 406, which filters contaminants that are introduced to the chemical etchant in the bath. In operation, one or more semiconductor wafers are lowered to contact the chemical etchant in the bath, which etches the semiconductor wafers. During this operation, the semiconductor wafers may be individually rotated at a slow rate of speed by the rotational-and-vertical drive mechanisms 212A, 212B and 212C of the wafer transfer c rousel 108, or the semiconductor wafers may be collectively rotated at a slow rate of speed by the rotational drive mechanism 204 of the wafer transfer carousel 108 to promote uniform etching of the wafers.

An exemplary wafer cleaning unit that may be included in the processing assembly 102 is virtually identical to the exemplary wet etching unit 402 of FIG. 4, except that the bath 404 contains a cleaning solution to clean one or more semiconductor wafers that are lowered to contact the cleaning solution in the bath. Similarly, an exemplary electroplating unit that may be included in the processing assembly 102 is virtually identical to the exemplary wet etching unit 402 of FIG. 4, except that the bath contains an electroplating solution. Furthermore, the exemplary electroplating unit includes an electrode in the bath, which is electrically connected as an anode. In operation, one or more semiconductor wafers are lowered to contact the electroplating solution in the bath. These semiconductor wafers are electrically connected as cathodes. Thus, the metals in the electroplating solution attaches to the wafers, forming a metal layer.

Other conventional processing units that may be included in the processing assembly 102 are well known, and thus, are only briefly described herein. An exemplary optical thickness measurement unit includes an optical detection device that is used to optically measure the thickness of features on one or more semiconductor wafers that are held by the wafer carriers 112A, 112B and 112C of the wafer transfer carousel 108. An exemplary wafer heating unit includes at least one heating element to provide sufficient electrical heat to one or more semiconductor wafers held by the wafer carriers of the wafer transfer carousel. An exemplary wafer coating/treatment unit includes at least one spraying nozzle to spay coating or wafer treating material to one or more semiconductor wafers that are held by the wafer carriers of the wafer transfer carousel.

Turning back to FIG. 1, the processing assembly 104 of the semiconductor processing system 100 includes a wafer transfer carousel 120 and a processing unit 122. The wafer transfer carousel 120 of the processing assembly 104 is structurally similar to the wafer transfer carousel 108 of the processing assembly 102. Thus, th wafer transfer carousel 120 includes the same structural components of the wafer transfer carousel 108. However, the wafer transfer carousel 120 is configured to accommodate four semiconductor wafers. Thus, the wafer transfer carousel 120 includes four wafers carriers 124A, 124B, 124C and 124D, four carrier positioning arms 126A, 126B, 126C and 126D, and four sets of carrier shaft (not shown) and rotational-and-vertical drive mechanism (not shown). Similar to the wafer transfer carousel 108 of the processing assembly 102, the wafer transfer carousel 120 may alternatively be configured to accommodate two to eight or more semiconductor wafers. The wafer transfer carousel 120 operates to rotate the four carrier positioning arms 126A, 126B, 126C and 126D in a counterclockwise direction. Thus, each wafer carrier of the wafer transfer carousel 120 can be rotated to any one of the processing positions B1, B2, B3 and B4 of the processing assembly 104, which are shown in FIG. 1.

Similar to the processing unit 110 of the processing assembly 102, the processing unit 122 of the processing assembly 104 may be a CMP unit, a wet etching unit, an electroplating unit, a wafer cleaning unit, an optical thickness measurement unit, a wafer heating unit, a wafer coating/treating unit, or any other conventional semiconductor processing unit that can operate on semiconductor wafers that are held by wafer carriers 124A, 124B, 124C and 124D. Thus, the processing unit 122 of the processing assembly 104 may perform the same semiconductor process as the processing unit 110 of the processing assembly 102. However, the operating parameters may differ between the two processing units. Alternatively, the processing unit 122 may perform a different type of semiconductor process from the processing unit 110.

The wafer transfer robot 106 of the semiconductor processing system 100 operates to transfer semiconductor wafers from the processing assembly 102 to the processing assembly 104. The wafer transfer robot is configured to reach the wafer carrier of the wafer transfer carousel 108 at the position A3 of the processing assembly 102 and the wafer carrier of the wafer transfer carousel 120 at the position B1 of the processing ass mbly 104. Thus, the wafer transfer robot is able to transfer a semiconductor wafer from the wafer carrier of the processing assembly 102 at the position A3 to the wafer carrier of the processing assembly 104 at the position B1. The wafer transfer robot may be any type of mechanical device that can transfer a semiconductor wafer from one wafer carrier to another wafer carrier.

The operation of the semiconductor processing system 100 is now described. A first semiconductor wafer to be processed is loaded onto the wafer carrier of the wafer transfer carousel 108 at the position A1 of the processing assembly 102, which is shown in FIG. 1 as being the wafer carrier 112A. The first semiconductor wafer is then sequentially processed at the positions A1, A2 and A3 of the processing assembly 102 by sequentially positioning the wafer carrier 112A at these positions. The sequential positioning of the wafer carrier 112A at the positions A1, A2 and A3 is achieved by a clockwise rotation of the wafer transfer carousel 108. After the first semiconductor wafer is processed at the position A3 of the processing assembly 102, which marks the end of the semiconductor process at the processing assembly 102, the first semiconductor wafer is unloaded from the wafer carrier 112A at the position A3 and is transferred to the wafer carrier of the wafer transfer carousel 120 at the position B1 of the processing assembly 104, which is shown in FIG. 1 as being the wafer carrier 124A, by the wafer transfer robot 106. The first semiconductor wafer is then sequentially processed at the positions B1, B2, B3 and B4 of the processing assembly 104 by sequentially positioning the wafer carrier 124A at these positions. The sequential positioning of the wafer carrier 124A at the positions B1, B2, B3 and B4 is achieved by a counterclockwise rotation of the wafer transfer carousel 120. After the first semiconductor wafer is processed at the position B4 of the processing assembly 104, which marks the end of the semiconductor process at the processing assembly 104, the first semiconductor wafer is unloaded from the wafer carrier 124A at the position B4 by an external mechanism and is transferred to the next destination, which may be a wafer cassette.

When the first semiconductor wafer is transferred from th position A1 of the processing assembly 102 to the position A2 of the processing assembly 102, a second semiconductor wafer to be processed is loaded onto the wafer carrier 112B of the wafer transfer carousel 108, which has been moved from the position A3 of the processing assembly 102 to the position A1 of the processing assembly 102. The second semiconductor wafer is then processed in the same manner as the first semiconductor wafer. During the operation, semiconductor wafers are typically processed simultaneously with the loading of wafers into the processing assemblies, the unloading of wafers from the processing assemblies, and the transferring of wafers between the processing assemblies. In this fashion, semiconductor wafers are sequentially processed by the semiconductor processing system 100.

Figure 5:
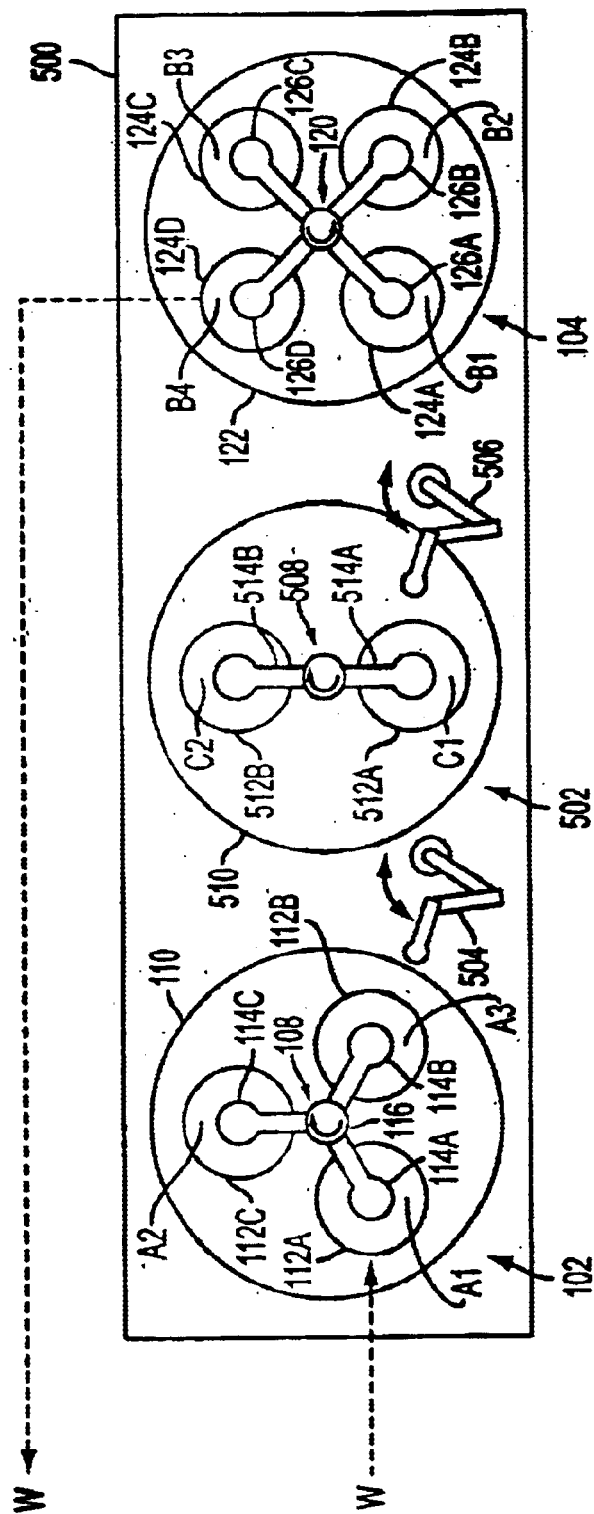
FIG. 5 is a plan view of a semiconductor processing syst m in accordance with a second embodiment of the present invention.

Turning now to FIG. 5, a semiconductor processing system 500 in accordance with a second embodiment of the invention is shown. The system 500 includes the processing assemblies 102 and 104, which were described above with reference to the semiconductor processing system 100 of FIG. 1. The system 500 further includes an additional processing assembly 502. In this embodiment, the semiconductor processing system includes two wafer transfer robots 504 and 506. Similar to the processing assemblies 102 and 104, the processing assembly 502 includes a wafer transfer carousel 508 and a processing unit 510. The wafer transfer carousel 508 of the processing assembly 510 is structurally similar to the wafer transfer carousels 108 and 120 of the processing assemblies 102 and 104. Thus, the wafer transfer carousel 508 includes the same structural components of the wafer transfer carousels 108 and 120. However, the wafer transfer carousel 508 is configured to accommodate two semiconductor wafers. Thus, the wafer transfer carousel 508 includes two wafers carriers 512A and 512B, two carrier positioning arms 514A and 514B, and two sets of carrier shaft (not shown) and rotational-and-vertical drive mechanism (not shown). Similar to the wafer transfer carousels 108 and 120, the wafer transfer carousel 508 may alternatively be configured to accommodate two to eight or more semiconductor wafers. The wafer transfer carousel 508 operates to rotate the two carrier wafers 512A and 512B in a clockwise or count rclockwise direction. Thus, each wafer carrier can be rotate to th processing position C1 or C2 of the processing assembly 502, which are shown in FIG. 5.

The wafer transfer robot 504 of the semiconductor processing system 500 operates to transfer semiconductor wafers from the processing assembly 102 to the processing assembly 502, while the wafer transfer robot 506 operates to transfer semiconductor wafers from the processing assembly 502 to the processing assembly 104. The wafer transfer robot 504 is configured to reach the wafer carrier of the wafer transfer carousel 108 at the position A3 of the processing assembly 102 and the wafer carrier of the wafer transfer carousel 508 at the position C1 of the processing assembly 502. Thus, the wafer transfer robot 504 is able to transfer a semiconductor wafer from the wafer carrier of the wafer transfer carousel 108 at the position A3 of the processing assembly 102 to the wafer carrier of the wafer transfer carousel 508 at the position C1 of the processing assembly 502. The wafer transfer robot 506 is configured to reach the wafer carrier of the wafer transfer carousel 508 at the position C1 of the processing assembly 502 and the wafer carrier of the wafer transfer carousel 120 at the position B1 of the processing assembly 104. Thus, the wafer transfer robot 506 is able to transfer a semiconductor wafer from the wafer carrier of the wafer transfer carousel 508 at the position C1 of the processing assembly 502 to the wafer carrier of the wafer transfer carousel 120 at the position B1 of the processing assembly 104. The wafer transfer robots 504 and 506 may be any type of mechanical device that can transfer a semiconductor wafer from one wafer carrier to another wafer carrier.

The operation of the semiconductor processing system 500 is now described. A first semiconductor wafer to be processed is loaded onto the wafer carrier of the wafer transfer carousel 108 at the position A1 of the processing assembly 102, which is shown in FIG. 5 as being the wafer carrier 112A. The first semiconductor wafer is then sequentially processed at the positions A1, A2 and A3 of the processing assembly 102 by sequentially positioning the wafer carrier 112A at these positions. The sequential positioning of the wafer carrier 112A at the positions A1, A2 and A3 is achieved by a clockwise rotation of the wafer transf r carousel 108. After the first semiconductor wafer is processed at the position A3 of the processing assembly 102, which marks the end of the semiconductor process at the processing assembly 102, the first semiconductor wafer is unloaded from the wafer carrier 112A at the position A3 and is transferred to the wafer carrier of the wafer transfer carousel 508 at the position C1 of the processing assembly 502, which is shown in FIG. 5 as being the wafer carrier 512A, by the wafer transfer robot 504. The first semiconductor wafer is then sequentially processed at the positions C1 and C2 of the processing assembly 502 by sequentially positioning the wafer carrier 512A at these positions. The sequential positioning of the wafer carrier 512A at the positions C1 and C2 is achieved by a clockwise or counterclockwise rotation of the wafer transfer carousel 508.

After the first semiconductor wafer is processed at the position C2 of the processing assembly 502, which marks the end of the semiconductor process at the processing assembly 502, the wafer carrier 512A is transferred back to the position C1 of the processing assembly 502. Back at the position C1 of the processing assembly 502, the first semiconductor wafer is unloaded from the wafer carrier 512A and is transferred to the wafer carrier of the wafer transfer carousel 120 at the position B1 of the processing assembly 104, which is shown in FIG. 5 as being the wafer carrier 124A, by the wafer transfer robot 506. The first semiconductor wafer is then sequentially processed at the positions B1, B2, B3 and B4 of the processing assembly 104 by sequentially positioning the wafer carrier 124A at these positions. The sequential positioning of the wafer carrier 124A at the positions B1, B2, B3 and B4 is achieved by a counterclockwise rotation of the wafer transfer carousel 120. After the first semiconductor wafer is processed at the position B4 of the processing assembly 104, which marks the end of the semiconductor process at the processing assembly 104, the first semiconductor wafer is unloaded from the wafer carrier 124A by an external mechanism and is transferred to the next destination.

When the first semiconductor wafer is transferred from the position A1 of the processing assembly 102 to the position A2 of the processing assembly 102, a second semiconductor wafer to b processed is loaded onto the wafer carrier 112B of the wafer transfer carousel 108, which has been moved from the position A3 of the processing assembly 102 to the position A1 of the processing assembly 102. The second semiconductor wafer is then processed in the same manner as the first semiconductor wafer. In this fashion, semiconductor wafers are sequentially processed by the semiconductor processing system 500.

Figure 6:
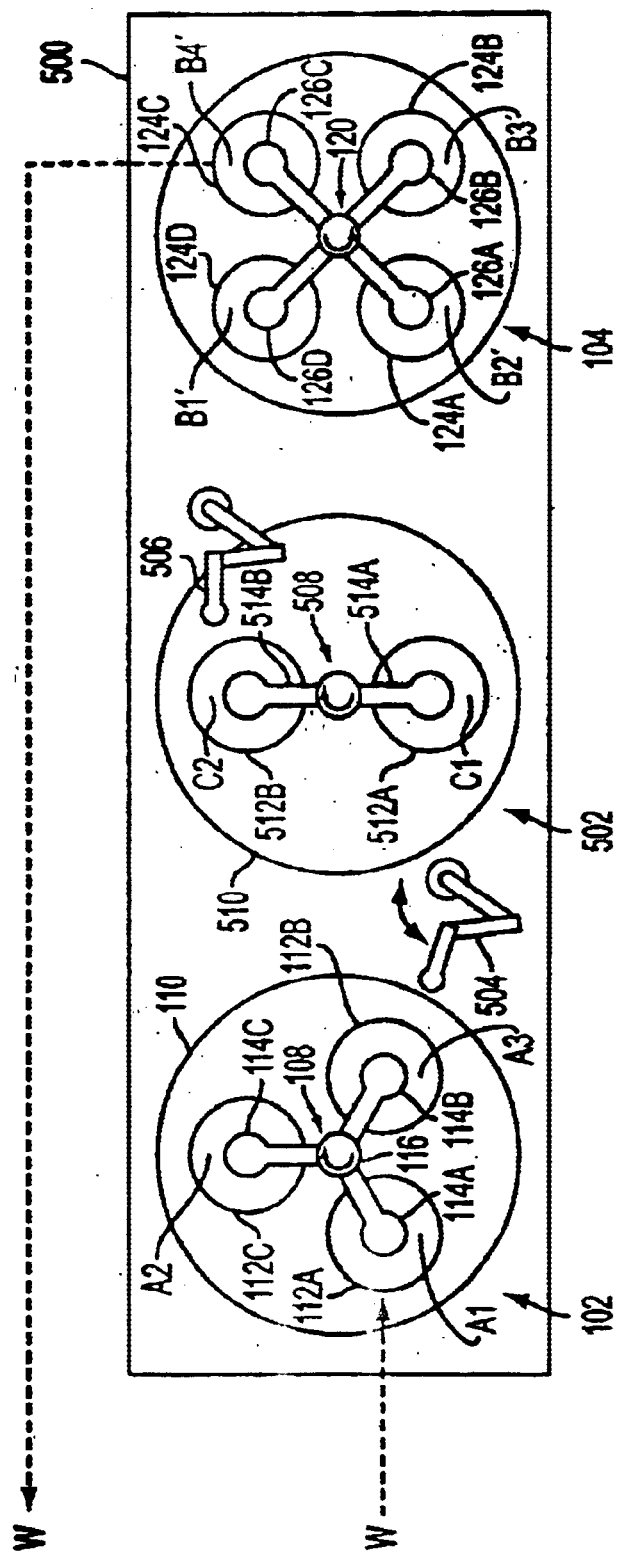
FIG. 6 is a plan view of the system of FIG. 5 in accordance with an alternative configuration.

In FIG. 6, an alternative configuration of the semiconductor processing system 500 is shown. The processing positions B1, B2, B3 and B4 of the processing assembly 104 have been renumbered in FIG. 6 as B2', B3', B4' and B1', respectively, to more clearly illustrate the processing order at the processing assembly 104. In this alternative configuration, the wafer transfer robot 506 is situated on the opposite side of the system 500, as compared to the wafer transfer robot 504. Consequently, the wafer transfer robot 506 is configured to reach the wafer carrier of the wafer transfer carousel 508 at the position C2 of the processing assembly 502 and the wafer carrier of the wafer transfer carousel 120 at the position B1' of the processing assembly 104. Thus, the wafer transfer robot 506 is able to transfer a semiconductor wafer from the wafer carrier of the wafer transfer carousel 508 at the position C2 of the processing assembly 502 to the wafer carrier of the wafer transfer carousel 120 at the position B1' of the processing assembly 104, which means that the wafer carriers 512A and 512B of the processing assembly 502 do not have to be returned to the position C1 of the processing assembly 502 to transfer semiconductor wafers from the processing assembly 502 to the processing assembly 104.

Figure 7:
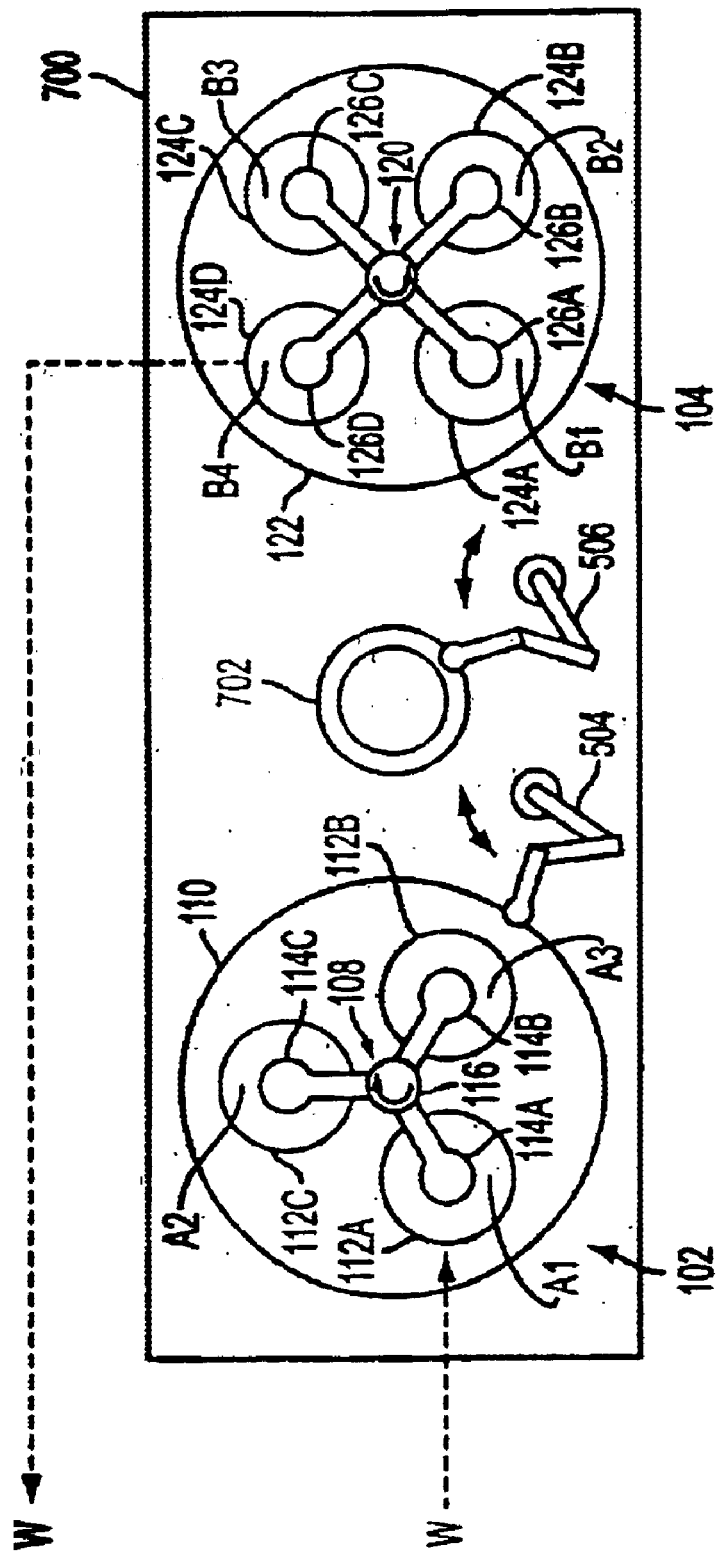
FIG. 7 is a plan view of a semiconductor processing system in accordance with a third embodiment of the present invention.

Turning now to FIG. 7, a semiconductor processing system 700 in accordance with a third embodiment is shown. The system 700 is similar to the semiconductor processing system 500 of FIG. 5. The only significant difference between these systems is that in the system 700 of FIG. 7, the processing assembly 502 has been replaced with a wafer processing station 702. The wafer processing station is configured to accommodate a single semiconductor wafer at a time. The wafer processing station may be designed to rinse and clean the semiconductor wafers that have been polished by the processing assembly 102 with a cleaning solution, such as deionized water. Furthermore, the wafer processing station may be designed to optically measure the thickness of features on the polished surface of the semiconductor wafer that is placed on the station. The wafer processing station may be configured to perform one or both of these semiconductor processes.

In this embodiment, the wafer transfer robot 504 is situated to reach the wafer carrier of the wafer transfer carousel 108 at the position A3 of the processing assembly 102 and the wafer processing station 702. Thus, the wafer transfer robot 504 can transfer a semiconductor wafer from the wafer carrier at the position A3 of the processing assembly 102 to the wafer processing station. Similarly, the wafer transfer robot 506 is situated to reach the wafer processing station 702 and the wafer carrier of the wafer transfer carousel 120 at the position B1 of the processing assembly 104. Thus, the wafer transfer robot 506 can transfer a semiconductor wafer from the wafer processing station 702 to the wafer carrier at the position B1 of the processing assembly 104.

In operation, semiconductor wafers are sequentially processed by the semiconductor processing system 700 in the following manner. A semiconductor wafer is loaded onto the wafer carrier 108 at the position A1 of the processing assembly 102, which is shown in FIG. 7 as being the wafer carrier 112A. The semiconductor wafer is then processed at the positions A1, A2 and A3 of the processing assembly 102. After the semiconductor wafer is processed at the position A3 of the processing assembly 102, the semiconductor wafer is transferred to the wafer processing station 702 by the wafer transfer robot 504. The semiconductor wafer is then processed at the wafer processing station and then transferred to the position B1 of the processing assembly 104 by the wafer transfer robot 506. The semiconductor wafer is then processed at the position B1, B2, B3 and B4 of the processing assembly 104. After being processed at the position B4 of the processing assembly 104, the semiconductor wafer is unloaded from the processing assembly 104 and is transferred to the next destination. Subsequent semiconductor wafers are processed in the same manner.

Figure 8:
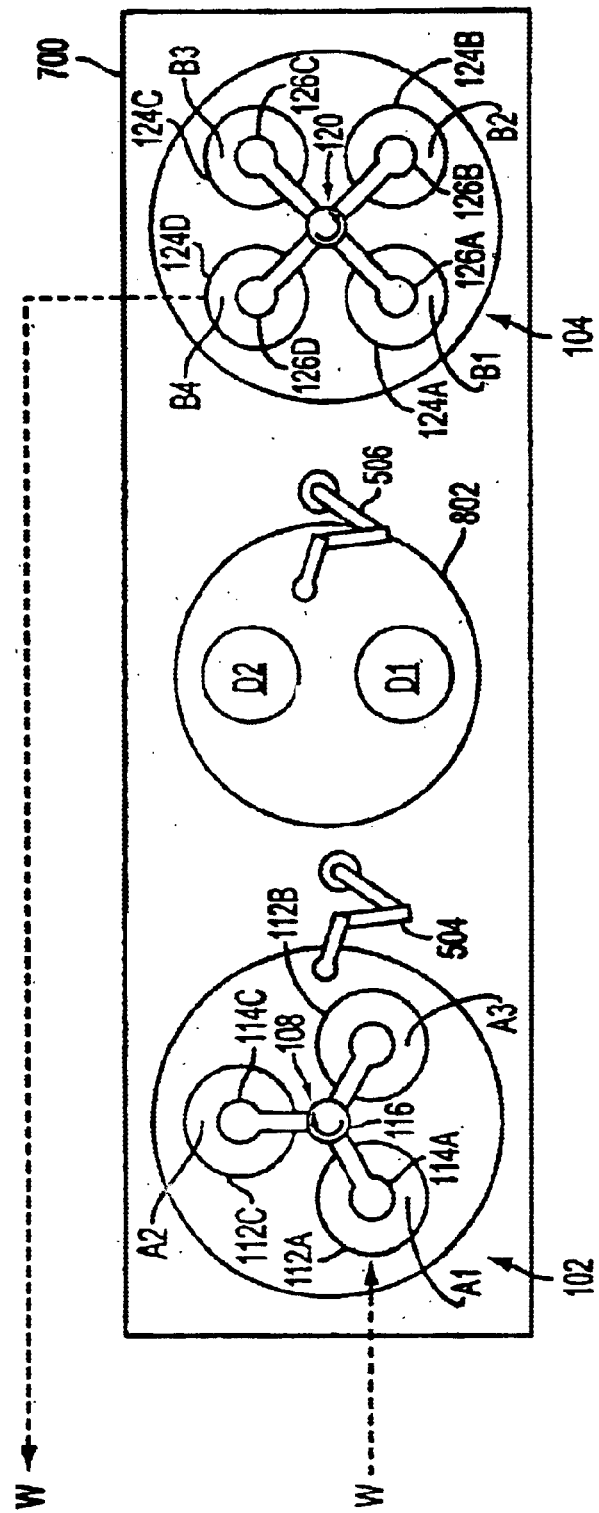
FIG. 8 is a plan view of the system of FIG. 7 in accordance with an alternative configuration.

The s miconductor proc ssing system 700 op rates well when the processing time at the wafer processing station 702 approximately equals the individual processing time at the positions A1, A2 and A3 of the processing assembly 102 and at the positions B1, B2, B3 and B4 of the processing assembly 104. However, if the processing time at the wafer processing station 702 is substantially greater than the individual processing time at the positions of the processing assemblies 102 and 104, then the wafer processing station will cause a congestion of semiconductor wafers. In such a situation, the wafer processing station can be replaced with a dual-wafer processing station 802, as shown in FIG. 8. The dual-wafer processing station includes two positions D1 and D2 to process two semiconductor wafers in parallel.

In this configuration, the wafer transfer robot 504 is situated to reach the wafer carrier of the wafer transfer carousel 108 at the position A3 of the processing assembly 102 and both of the positions D1 and D2 of the dual-wafer processing station 802. Thus, the wafer transfer robot 502 can transfer a semiconductor wafer from the wafer carrier at the position A3 of the processing assembly 102 to the position D1 of the dual-wafer processing station or the position D2 of the dual-wafer processing station. Similarly, the wafer transfer robot 506 is situated to reach the wafer carrier of the wafer transfer carousel 120 at the position B1 of the processing assembly 104 and both of the positions D1 and D2 of the dual-wafer processing station. Thus, the wafer transfer robot 506 can transfer a semiconductor wafer from either the position D1 of the dual-wafer processing station or the position D2 of the dual-wafer processing station to the wafer carrier at the position B1 of the processing assembly 104.

In operation, semiconductor wafers are sequentially processed by the processing assembly 102 in the same manner as described above with respect to FIG. 7. However, in this configuration, the semiconductor wafers are processed at either the position D1 of the dual-wafer processing station 802 or the position D2 of the dual-wafer processing station. Thus, some of the semiconductor wafers are processed at the position A1, A2 and A3 of the processing assembly 102, the position D1 of the dual-waf r processing station, and the positions B1, B2, B3 and B4 of the processing assembly 104. The other semiconductor wafers are processed at the position A1, A2 and A3 of the processing assembly 102, the position D2 of the dual-wafer processing station, and the positions B1, B2, B3 and B4 of the processing assembly 104.

Figure 9:
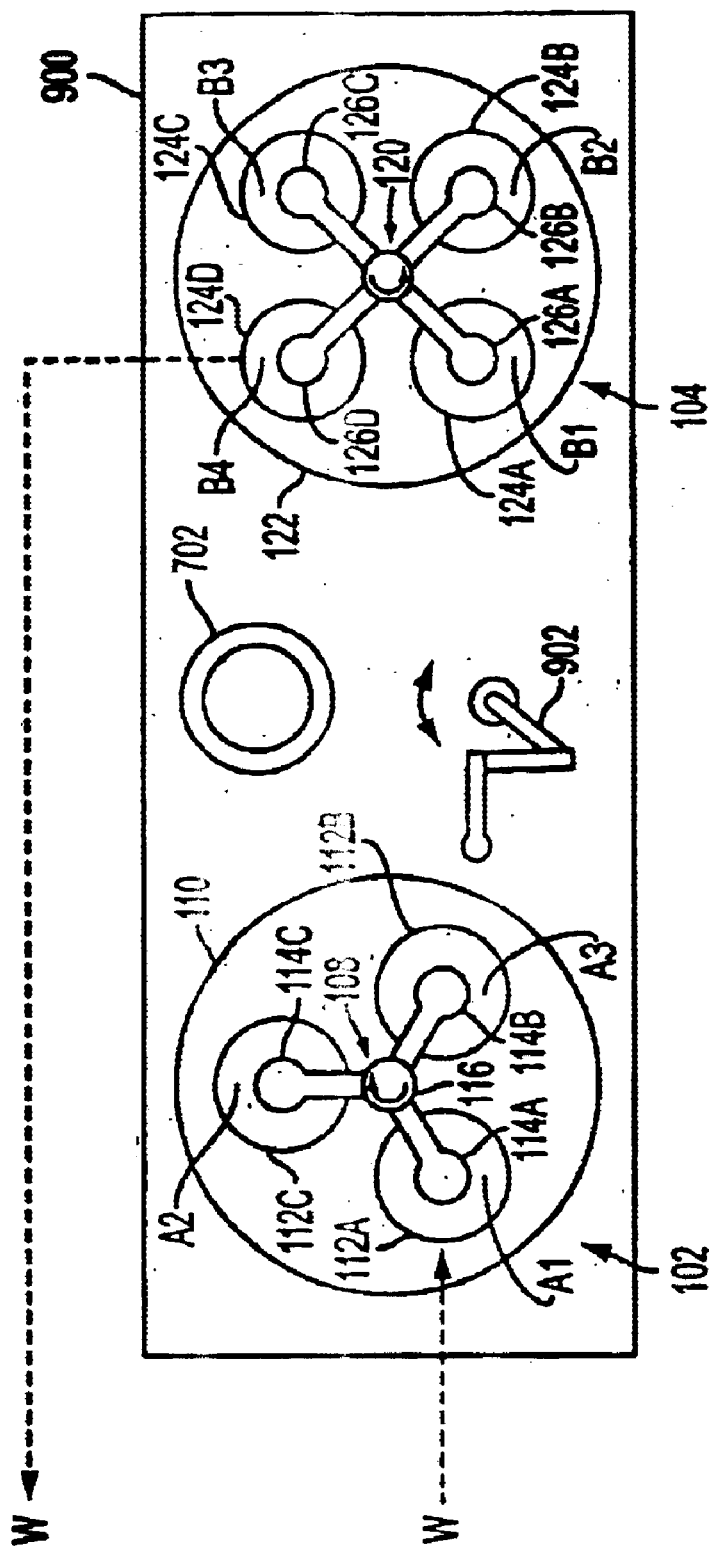
FIG. 9 is a plan view of a semiconductor processing system in accordance with a fourth embodiment of the present invention.

In FIG. 9, a semiconductor processing system 900 in accordance with a fourth embodiment of the invention is shown. Similar to the processing system 700 of FIG. 7, the system 900 includes the processing assemblies 102 and 104, and the wafer processing station 702. However, in this embodiment, the system 900 includes a single wafer transfer robot 902 that is designed to transfer semiconductor wafers from the wafer carrier of the wafer transfer carousel 108 at the position A3 of the processing assembly 102 to the wafer processing station 702, and to transfer semiconductor wafers from the wafer processing station to the wafer carrier of the wafer transfer carousel 120 at the position B1 of the processing assembly.

In operation, semiconductor wafers are sequentially processed by the semiconductor processing system 900 in the following manner. A semiconductor wafer is loaded onto the wafer carrier of the processing assembly 102 at the position A1, which is shown in FIG. 9 as being the wafer carrier 112A. The semiconductor wafer is then sequentially processed at the positions A1, A2 and A3 of the processing assembly 102. After being processed at the position A3 of the processing assembly 102, the semiconductor wafer is unloaded from the wafer carrier 112A and is transferred to the wafer processing station 702 by the wafer transfer robot 902. At the wafer processing station, the semiconductor wafer is cleaned and/or measured for thickness. The semiconductor wafer is then transferred from the wafer processing station to the wafer carrier of the processing assembly 104 at the position B1, which is shown in FIG. 9 as being the wafer carrier 124A, by the wafer transfer robot 902. The semiconductor wafer is then sequentially processed at the position B1, B2, B3 and B4 of the processing assembly 104.

After being processed at the position B4 of the processing assembly 104, the semiconductor wafer is unloaded from the wafer carrier 124A and is transferred to th next destination. Subsequ nt semiconductor waf rs ar processed in the same manner.

In the above-described operation, semiconductor wafers to be processed are loaded onto the semiconductor processing system 900 at one location, i.e., the position A1 of the processing assembly 102, and the finished semiconductor wafers are unloaded from the semiconductor processing system at another location, i.e., the position B4 of the processing assembly 104. However, the operation of the semiconductor processing system may be modified so that the load location is the same location as the unload location. Two such modified operations of the semiconductor processing system are described below.

In a first modified operation of the semiconductor processing system 900, semiconductor wafers are sequentially processed by the semiconductor processing system in the following manner. A semiconductor wafer is loaded onto the wafer carrier of the processing assembly 102 at the position A1, which is shown in FIG. 9 as being the wafer carrier 112A. The semiconductor wafer is then sequentially processed at the positions A1, A2 and A3 of the processing assembly 102. After being processed at the position A3 of the processing assembly 102, the semiconductor wafer is unloaded from the wafer carrier 112A and is transferred to the wafer processing station 702 by the wafer transfer robot 902. At the wafer processing station, the semiconductor wafer is cleaned and/or measured for thickness. The semiconductor wafer is then transferred from the wafer processing station to the wafer carrier of the processing assembly 104 at the position B1 by the wafer transfer robot 902, which is shown in FIG. 9 as being the wafer carrier 124A. The semiconductor wafer is then sequentially processed at the position B1, B2, B3 and B4 of the processing assembly 104. After being processed at the position B4 of the processing assembly 104, the semiconductor wafer is returned to the position B1 of the processing assembly 104, where the wafer is unloaded from the wafer carrier 124A and is transferred to the wafer carrier of the processing assembly at the position A3 of the processing assembly 102, which is shown in FIG. 9 as being the wafer carrier 112B. The wafer carrier 112B is then returned to the position A1 of the processing assembly 102, where the semiconductor wafer is unloaded from the wafer carrier 112B and is transferred to the next destination. After being processed at the position B4 of the processing assembly 104, the semiconductor wafer is not processed at any other position. The semiconductor wafer is only brought back to the position A1 of the processing assembly 102 for unloading. Subsequent semiconductor wafers are processed in the same manner.

In a second modified operation, semiconductor wafers are sequentially processed by the semiconductor processing system 900 in the following manner. A semiconductor wafer is loaded onto the wafer carrier of the processing assembly at the position A1, which is shown in FIG. 9 as being the wafer carrier 112A. The wafer transfer carousel 108 is then rotated so that the semiconductor wafer is moved to the position A3 of the processing assembly 102. In this second modified operation, the wafer transfer carousel 108 is rotated in a counterclockwise direction. That is, the wafer carrier 112A of the processing assembly 102 is sequentially transferred from the position A1 to the position A3, from the position A3 to the position A2, and from the position A2 back to the position A1. During the transfer from the position A1 to the position A3 of the processing assembly 102, the semiconductor wafer is not processed. From the position A3 of the processing assembly 102, the semiconductor wafer is transferred to the wafer carrier of the wafer transfer carousel 120 at the position B1 of the processing assembly 104, which is shown in FIG. 9 as being the wafer carrier 124A. The semiconductor wafer is then sequentially processed at the positions B1, B2, B3 and B4 of the processing assembly 104. After being processed at the position B4 of the processing assembly 104, the semiconductor wafer is unloaded from the wafer carrier 124A and is transferred to the wafer processing station 702 by the wafer transfer robot 902. At the wafer processing station, the semiconductor wafer is cleaned and/or measured for thickness. The semiconductor wafer is then transferred from the wafer processing station to the wafer carrier of the wafer transfer carousel 108 at the position A3 of the processing assembly 102, which is shown in FIG. 9 as being the wafer carrier 112B, by the wafer transfer robot 902. The semiconductor wafer is then sequentially processed at the position A3, A2 and A1 of the processing assembly 102. After being processed at the position A1 of the processing assembly 102, the semiconductor wafer is unloaded from the wafer carrier 112B and is transferred to the next destination. Subsequent semiconductor wafers are processed in the same manner.

Figure 10:
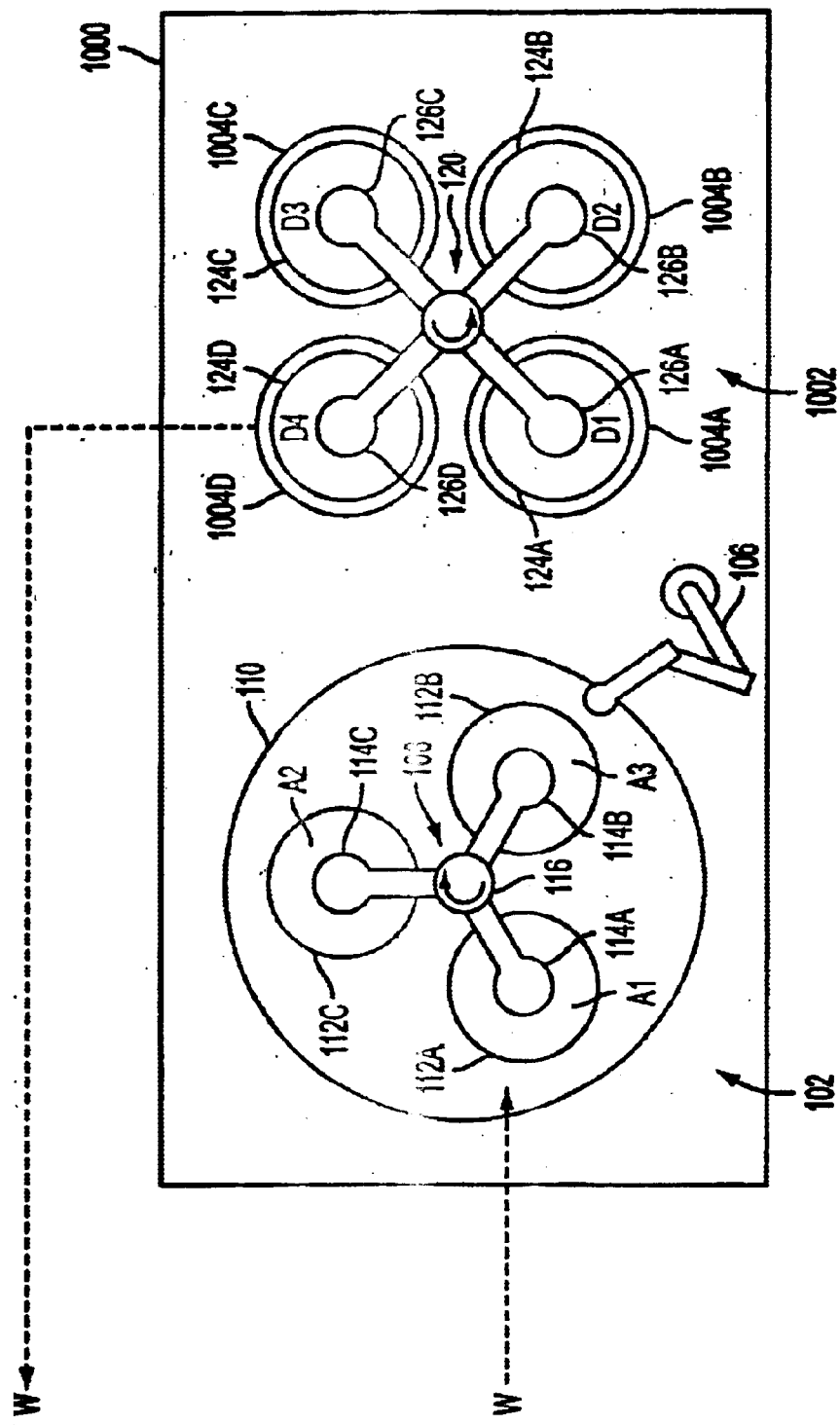
FIG. 10 is a plan view of a semiconductor processing system in accordance with a fifth embodiment of the present invention.
Figure 11:
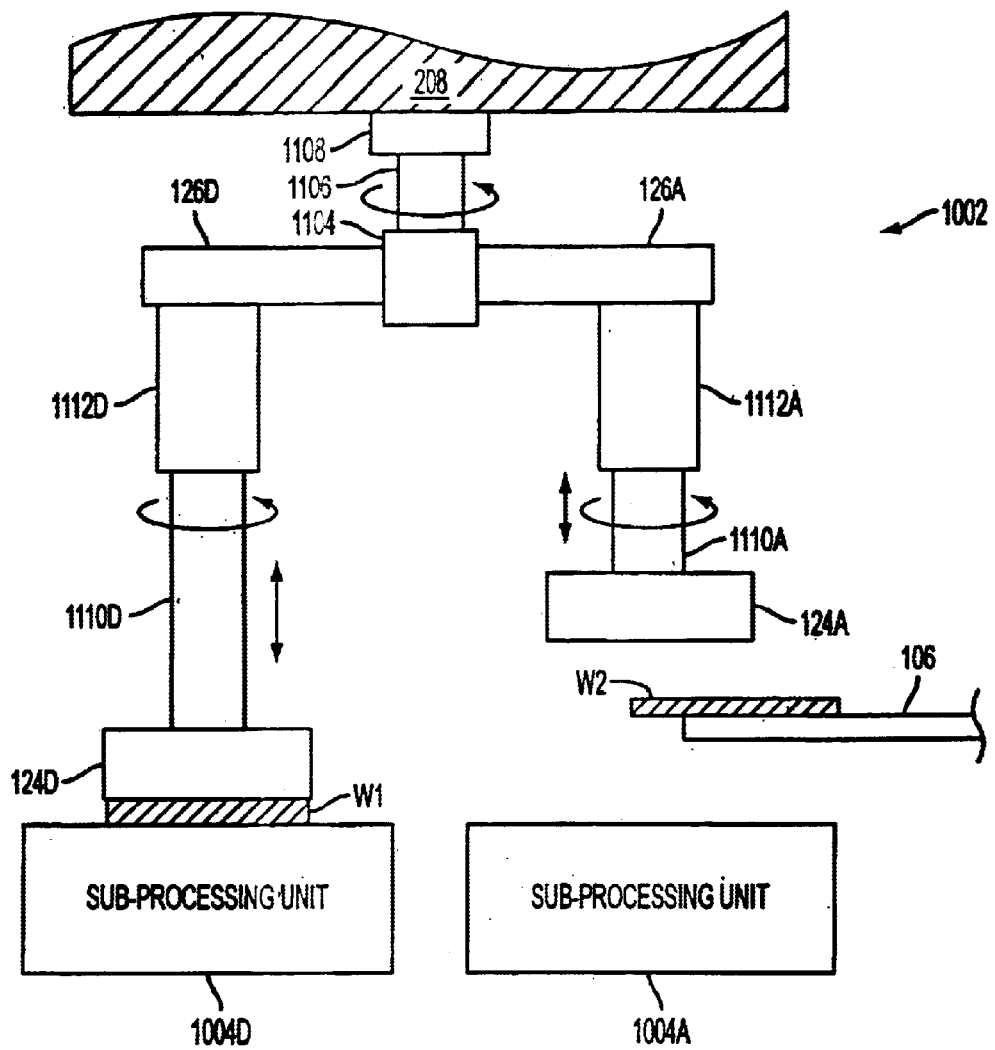
FIG. 11 is a side view of a processing assembly with sub-processing units of the system of FIG. 10 in which the sub-processing units operate on semiconductor wafers held by wafer carriers.

Turning now to FIG. 10, a semiconductor processing system 1000 in accordance with a fifth embodiment of the invention is shown. Similar to the semiconductor processing system 100 of FIG. 1, the semiconductor processing system 1000 includes the processing assembly 102 and the wafer transfer robot 106. However, in this embodiment, the processing assembly 104 has been replaced with a processing assembly 1002. The processing assembly 1002 includes the wafer transfer carousel 120 and four sub-processing units 1004A, 1004B, 1004C and 1004D. Each of the sub-processing units of the processing assembly is configured to process a single semiconductor wafer. Thus, each sub-processing unit corresponds to a processing position of the processing assembly 1002. The sub-processing units 1004A, 1004B, 1004C and 1004D correspond the positions D1, D2, D3 and D4 of the processing assembly 1002, respectively. Similar to the processing units 110, 122 and 510, each sub-processing unit may be any type of wafer processing unit that can operate on a semiconductor wafer held by a wafer carrier, such as a CMP unit, a wet etching unit, an electroplating unit, a wafer cleaning unit, an optical thickness measurement unit, a wafer heating unit and a wafer coating/treating unit. In operation, the sub-processing units are selectively engaged to process semiconductor wafers by lowering one or more wafer carriers 124A, 124B, 124C and 124D with the wafers to the sub-processing units, as illustrated in FIG. 11. In FIG. 11, a semiconductor wafer W1 on the wafer carrier 124D is processed by the sub-processing unit 1004D, while a semiconductor wafer W2 is loaded onto the wafer carrier 124A.

FIG. 11 is a side view of the processing assembly 1002. Thus, components of the wafer transfer carousel 120 that were not visible in FIG. 10 are shown in FIG. 11. Similar to the wafer carousel 108, the wafer transfer carousel includes a central connector 1104, a central shaft 1106 and a rotational drive mechanism 1108. The wafer transfer carousel 120 further includes four sets of wafer shaft 1110A, 1110B, 1110C and 1110D, and rotational-and-vertical drive mechanism 1112A, 1112B, 1112C and 1112D, which connect the wafer carriers 124A, 124B, 124C and 124D to their corresponding carrier positioning arms 126A, 126B, 126C and 126D. In FIG. 11, only the wafer shafts 1110A and 1110D, and rotational-and-vertical drive mechanisms 1112A and 1112D that are connected to the wafer carriers 124A and 124D are shown.

Although the sub-processing units 1004A, 1004B, 1004C and 1004D are illustrated as being circular in shape, these units may be non-circular. As an example, the sub-processing units may be substantially square shaped. The shape of the sub-processing units is not critical to the invention.

Figure 12:
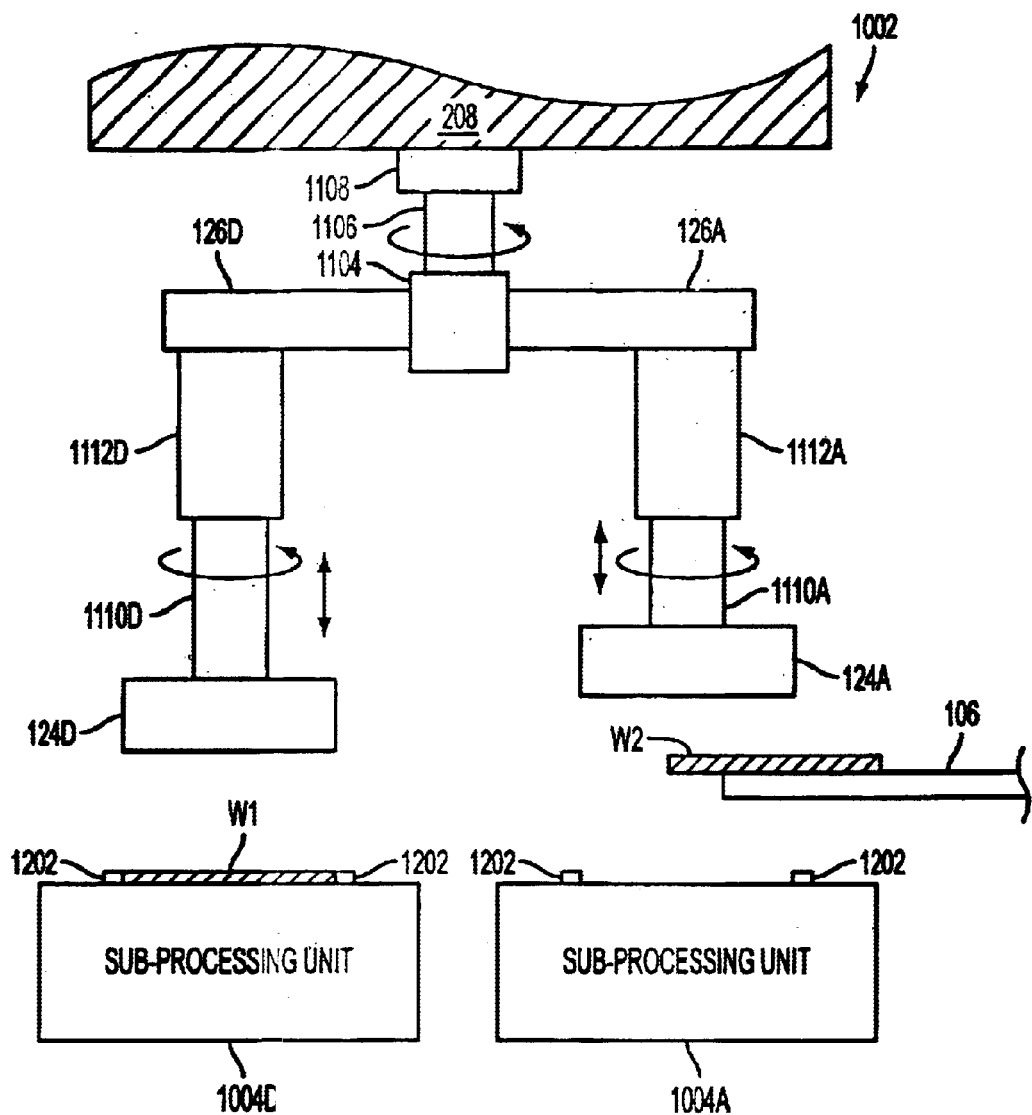
FIG. 12 is a side view of a processing assembly with sub-processing units of the system of FIG. 10 in which the sub-processing units operate on semiconductor wafers placed on the sub-processing units.

In an alternative configuration, the sub-processing units 1004A, 1004B, 1004C and 1004D of the processing assembly 1002 may operated on semiconductor wafers that are placed on the sub-processing units. In this configuration, the semiconductor wafers are turned over by the wafer transfer robot 106 before being loaded onto the wafer carriers 124A, 124B, 124C and 124D such that the wafer surfaces to be processed are facing upward, away from the sub-processing units, when the wafers are placed in wafer holders 1202 on the sub-processing units, as illustrated in FIG. 12. Since the wafer surfaces to be processed are facing upward, each sub-processing unit may be any type of water processing unit that can process semiconductor wafers in such orientation. As an example, each sub-processing unit may be a CMP unit that utilizes a polishing pad (not shown), which has a polishing surface area smaller than the semiconductor wafers being polished. The polishing pad is scanned across a given semiconductor wafer to polish the upper surface of the wafer. As another example, each sub-processing unit may be a wafer cleaning unit or a wet etching unit that utilizes one or more nozzles (not shown) to apply a suitable solution to the upper surfaces of the semiconductor wafers being processed. The sub-processing units may all be the same type of wafer processing units. Alternatively, the sub-processing units may be a combination of different types of wafer processing units.

The operation of the semiconductor processing system 100D of FIG. 10 is similar to the operation of the semiconductor processing assembly 100 of FIG. 1. Semiconductor wafers are sequentially processed by the semiconductor processing system 1000 in the following manner. A semiconductor wafer is loaded onto the wafer carrier of the wafer transfer carousel 108 at the position A1 of the processing assembly 102, which is shown in FIG. 10 as being the wafer carrier 112A. The semiconductor wafer is then sequentially processed at the positions A1, A2 and A3 of the processing assembly 102. After being processed at the position A3 of the processing assembly 102, the semiconductor wafer is unloaded from the wafer carrier 112A and is transferred to the wafer carrier of the wafer transfer carousel 120 at the position D1 of the processing assembly 104, which is shown in FIG. 10 as being the wafer carrier 124A, by the wafer transfer robot 106. The semiconductor wafer is sequentially processed at the sub-processing stations 1004A, 1004B, 1004C and 1004D of the processing assembly 1002, which correspond to the positions D1, D2, D3 and D4 of the processing assembly 1002. After being processed at the sub-processing unit 1004D, the semiconductor wafer is unloaded from the wafer carrier 124A and is transferred to the next destination. Subsequent semiconductor wafers are processed in the same manner.

Figure 13:
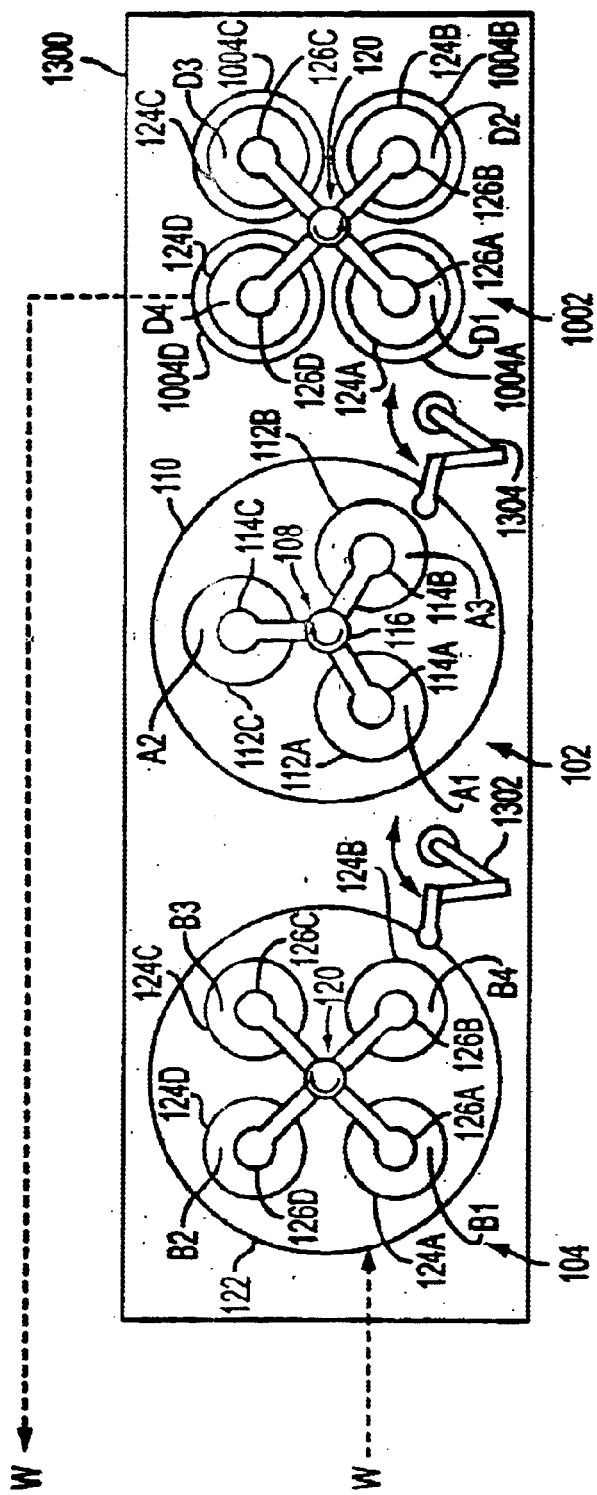
FIG. 13 is a plan view of a semiconductor processing system in accordance with a sixth embodiment of the present invention.

Turning now to FIG. 13, a semiconductor processing system 1300 in accordance with a sixth embodiment of the invention is shown. Similar to the semiconductor processing system 1000 of FIG. 10, the semiconductor processing system includes the processing assemblies 102 and 1002. However, the system further includes the processing assembly 104. Thus, the system 1300 includes three processing assemblies. However, in this embodiment, the wafer transfer carousel 120 of the processing assembly 104 rotates in the clockwise direction and thus, the positions of the processing assembly 104 has been renumbered accordingly to more clearly illustrate the processing order at the processing assembly 104. Since the system includes three processing assemblies, the system includes two wafer transfer robots 1302 and 1304 to transfer semiconductor wafers from the processing assembly 104 to the processing assembly 102, and to transfer semiconductor wafers from the processing assembly 102 to the processing assembly 1002. Although the semiconductor processing system 1300 can be configured to perform various combinations of semiconductor processes, the system is particularly suitable for performing two-stage CMP polishing and then performing post-CMP processing. The post-CMP processing may involve two stages of cleaning, spin drying and thickness measuring of wafer surfaces features.

In operation, semiconductor wafers are sequentially processed by the semiconductor processing system 1300 in the following manner. A semiconductor wafer is loaded onto the wafer carrier of the wafer transfer carousel 120 at the position B1 of the processing assembly 104, which is shown in FIG. 13 as being the wafer carrier 124A. The semiconductor wafer is then sequentially processed at the positions B1, B2, B3 and B4 of the processing assembly 104. After being processed at the position B4 of the processing assembly 104, the semiconductor wafer is unloaded from the wafer carrier 124A and is transferred to the wafer carrier of the wafer transfer carousel 108 at the position A1 of the processing assembly 102, which is shown in FIG. 13 as being the wafer carrier 112A, by the wafer transfer robot 1302. The semiconductor wafer is then sequentially processed at the positions A1, A2 and A3 of the processing assembly 102. After being processed at the position A3 of the processing assembly 102, the semiconductor wafer is unloaded from the wafer carrier 112A and is transferred to the wafer carrier of the wafer transfer carousel 120 at the sub-processing unit 1004A or the position D1 of the processing assembly 1002, which is shown as the wafer carrier 124A. The semiconductor wafer is then sequentially processed at the sub-processing units 1004A, 1004B, 1004C and 1004D. After being processed at the sub-processing unit 1004D of the processing assembly 1002, the semiconductor wafer is unloaded from the wafer carrier 124A and is transferred to the next destination. Subsequent semiconductor wafers are processed in the same manner.

Figure 14:
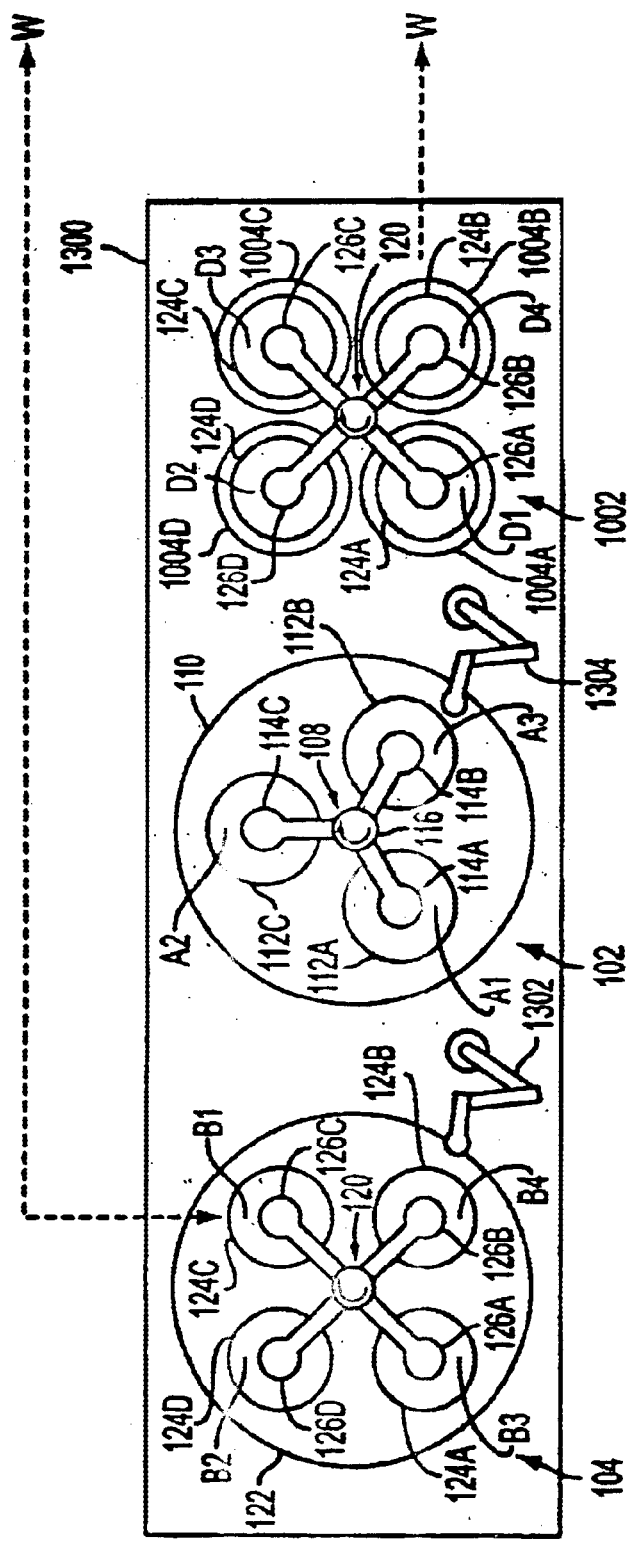
FIG. 14 is a plan view of the system of FIG. 13 in which semiconductor wafers are loaded from the right side of the system and the finished semiconductor wafers are unloaded from the right side of the system.

In the above-described operation, semiconductor wafers to be processed are loaded onto the semiconductor processing system 1300 from the left side of the system and the finished semiconductor wafers are unloaded from the semiconductor processing system so that the finished semiconductor wafers can be transferred back to the left side of the system. In a modified operation, semiconductor wafers to be processed are loaded onto the semiconductor processing system from the right side of the system and the finished semiconductor wafers are unloaded from the semiconductor processing system so that the finished semiconductor wafers can be transferred back to the right side of the system, as illustrated in FIG. 14.

The modified operation of the semiconductor processing system 1300 is described with reference to FIG. 14, in which the processing positions of the processing assembly 104 and the processing positions of the processing assembly 1002 have been renumbered as to more clearly illustrate the processing order at the processing assemblies 104 and 1002. In the modified operation, semiconductor wafers are sequentially processed by the semiconductor processing system in the following manner. A semiconductor wafer is transferred to the system from an external source (not shown), which is located to the right of the system, and is loaded onto the wafer carrier of the wafer transfer carousel 120 at the position B1 of the processing assembly 104, which is shown in FIG. 14 as being the wafer carrier 124C. The semiconductor wafer is then sequentially processed at the positions B1, B2, B3 and B4 of the processing assembly 104. Thus, the wafer transfer carousel 120 of the processing assembly 104 is configured to rotate in the counterclockwise direction. After being processed at the position B4 of the processing assembly 104, the semiconductor wafer is unloaded from the wafer carrier 124C and is transferred to the wafer carrier of the wafer carousel 108 at the position A1 of the processing assembly 104, which is shown in FIG. 14 as being the wafer carrier 112A, by the wafer transfer robot 1302. The semiconductor wafer is then sequentially processed at the positions A1, A2 and A3 of the processing assembly 102. After being processed at the position A3 of the processing assembly 102, the semiconductor wafer is unloaded from the wafer carrier 112A and is transferred to the wafer carrier of the wafer transfer carousel 120 at the sub-processing unit 1004A or the position D1 of the processing assembly 1002, which is shown in FIG. 14 as being the wafer carrier 124A. The semiconductor wafer is then sequentially processed at the sub-processing units 1004A, 1004D, 1004C and 1004B, which correspond to the positions D1, D2, D3 and D4, respectively. Thus, the wafer transfer carousel 120 of the processing assembly 1002 is configured to rotate in the clockwise direction. After being processed at the sub-processing unit 1004B of the processing assembly 1002, the semiconductor wafer is unloaded from the wafer carrier 124A and is transferred to the next destination, which is loaded on the right side of the system. Subsequent semiconductor wafers are processed in the same manner.

The above-described modified operation may also be applied to the semiconductor processing systems 100, 500, 700, 900, 1000 of FIGS. 1 and 5–10 so that semiconductor wafers are loaded from the right side of the respective system and the finished semiconductor wafers are unloaded and transferred back to the right side of that system.

Figure 15:
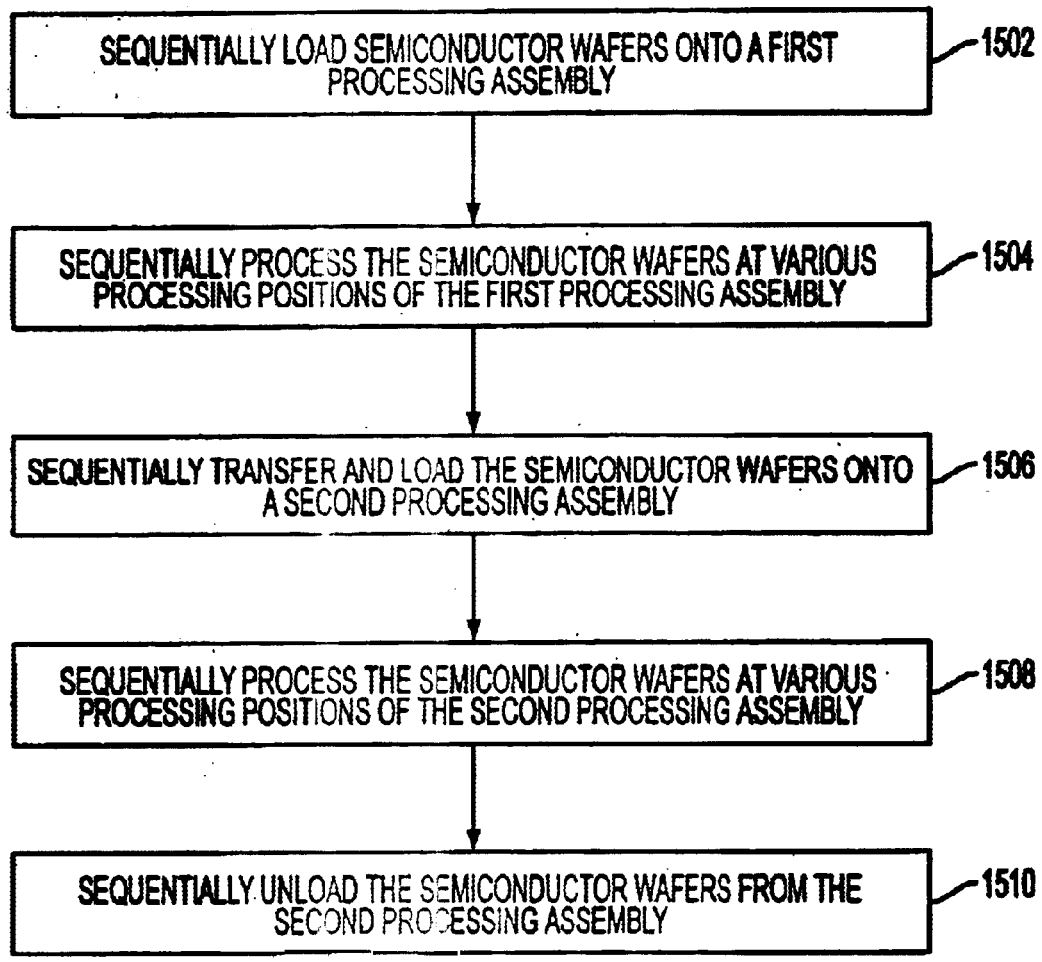
FIG. 15 is a process flow diagram of a method of processing semiconductor wafers in accordance with the present invention.

A method for processing semiconductor wafers in accordance with the invention is described with reference to FIG. 15. At step 1502, semiconductor wafers are sequentially loaded onto a first processing assembly at an initial processing position of the first processing assembly. At step 1504, the semiconductor wafers are sequentially processed at various processing positions of the first processing assembly. The sequential processing includes moving the semiconductor wafers to the various processing positions of the first processing assembly using the rotation of a wafer transfer carousel of the first processing assembly, which supports the semiconductor wafers. In an exemplary embodiment, steps 1502 and 1504 are performed in parallel such that when a semiconductor wafer is at one of the processing positions other than the initial processing position, another semiconductor wafer is loaded into the initial processing position, where initial processing can take place. The process performed by the first processing assembly may include one or more of the following semiconductor processes: polishing, wet etching, electroplating, cleaning, measuring for thickness, heating and coating. Next, at step 1506, the semiconductor wafers that have been processed by the first processing assembly are sequentially transferred and loaded onto a second processing assembly at an initial processing position of the second processing assembly. At step 1508, the semiconductor wafers are sequentially processed at various processing positions of the second processing assembly. The sequential processing includes moving the semiconductor wafer to the various processing positions of the second processing assembly by using the rotation of a wafer transfer carousel of the second processing assembly. The process performed by the second processing assembly may also include one or more of the following semiconductor processes: polishing, wet etching, electroplating, cleaning, measuring for thickness, heating and coating. Next, at step 1510, the semiconductor wafers that have been processed by the second processing assembly are sequentially unloaded from the second processing assembly and are transferred to the next destination.

Although specific embodiments of the invention have been described and illustrated, the invention is not to be limited to the specific forms or arrangements of parts so described and illustrated. The scope of the invention is to be defined by the claims appended hereto and their equivalents.

What is claimed is:

1. A system for processing objects comprising:
    a plurality of object processing assemblies that are each configured to process said objects, each of said object processing assemblies comprising:
        an object transfer mechanism having a plurality of object carriers, each of said object carriers being configured to hold at least one of said objects, said object transfer mechanism being configured to move said object carriers to transfer said objects to different processing positions; and
        an object processing unit operatively associated with said transfer mechanism to process said object transferred to said different processing positions by said object carriers of said object transfer mechanism; and
    an object transfer device configured to unload an object from a first one of said plurality of object processing assemblies and to transfer the object to a second one of said plurality of object processing assemblies.

2. The system of claim 1 wherein said object transfer mechanism includes a carousel that can rotate to move said object carriers in a substantially circular path.

3. The system of claim 1 further comprising a second object transfer device situated between two selected object processing assemblies of said object processing assemblies to transfer said objects between said two selected object processing assemblies, said second object transfer device and said object transfer device being situated on opposite sides of said system.

4. The system of claim 1 wherein said processing unit is configured to perform a process selected from a group consisting of polishing, wet etching, electroplating, cleaning, thickness measuring, heating, coating and treating.

5. The system of claim 1 wherein said processing unit of one of said processing assemblies includes a plurality of sub-processing units to process some of said objects.

6. The system of claim 5 wherein at least one of said sub-processing units is configured to perform a process selected from a group consisting of polishing, wet etching, electroplating, cleaning, thickness measuring, heating, coating and treating.

7. The system of claim 5 wherein at least one of said sub-processing unit is configured to process one of said objects when that object is placed on that sub-processing unit with the surface to be processed facing away from that sub-processing unit.

8. The system of claim 5 wherein at least one of said sub-processing units is configured to process one of said objects held by one of said object carriers associated with said sub-processing units.

9. The system of claim 1 further comprising an object processing station operatively associated with said object transfer device to process said objects placed on said object processing station.

10. The system of claim 9 wherein said object processing station is configured to process two or more of said objects in parallel.

11. The system of claim 9 wherein said object processing station is configured to perform a process selected from a group consisting of cleaning and thickness measuring.

12. A method of processing objects comprising:
processing said objects at processing positions of a first object processing assembly, including moving said objects to said processing positions of said first object processing assembly using a first object transfer mechanism of said first object processing assembly, said objects being supported by said first object transfer mechanism;
transferring said objects that have been processed by said first object processing assembly to a second object processing assembly wherein an object transfer device is employed for unloading said objects from the first object processing assembly and transferring said objects to the second object processing assembly; and
processing said objects at processing positions of said second object processing assembly, including moving said objects to said processing positions of said second object processing assembly using a second object transfer mechanism of said second object processing assembly, said objects being supported by said second object transfer mechanism.

13. The method of claim 12 where said step of moving said objects to said processing positions of said first object processing assembly includes rotating said first object transfer mechanism to move said objects to said processing positions of said first object processing assembly.

14. The method of claim 12 wherein at least one of said step of processing said objects at said processing positions of said first object processing assembly and said step of processing said objects at said processing positions of said second object processing assembly includes performing a process selected from a group consisting of polishing, wet etching, electroplating, cleaning, thickness measuring, heating, coating and treating.

15. The method of claim 12 further comprising a step of transferring said objects that have been processed by said second object processing assembly to a third object processing assembly, including unloading said objects from said second object processing assembly at a different processing position of said second object processing assembly from the processing position at which said objects were loaded onto said second object processing assembly.

16. The method of claim 12 wherein at least one of said step of processing said object at said processing positions of said first object processing assembly and said step of processing said object at said processing positions of said second object processing assembly includes processing said objects at sub-processing units.

17. The method of claim 16 wherein said step of processing said objects at said sub-processing units includes performing a process selected from a group consisting of polishing, wet etching, electroplating, cleaning, thickness measuring, heating, coating and treating at one or more of said sub-processing units.

18. The method of claim 16 further comprising a step of placing one of said objects on one of said sub-processing units, including turning over that object such that the surface to be process is faced away from that sub-processing unit.

19. The method of claim 16 wherein said step of processing said objects at said sub-processing units includes holding one of said object while processing that object at one of said sub-processing units.

20. The method of claim 12 further comprising a step of transferring said objects that have been processed by said first object processing assembly to an object processing station to process said object at said object processing station.

21. The method of claim 20 wherein said step of transferring said objects that have been processed by said first object processing assembly to said object processing station includes placing two or more of said objects on said object processing station to process two or more said objects in parallel.

22. The method of claim 20 wherein said step of transferring said objects that have been processed by said first object processing assembly to said object processing station includes performing a process selected from a group consisting of cleaning and thickness measuring.

23. A system for processing semiconductor objects comprising:
a first object processing assembly that is configured to process said semiconductor objects;
a second object processing assembly that is configured to further process said semiconductor objects; and
an object transfer device configured to unload said objects from the first object processing assembly and to transfer said objects to the second object processing assembly,
each of said first and second object processing assemblies including:
an object transfer carousel having a plurality of object carriers, each of said object carriers being configured to hold at least one of said semiconductor objects, said object transfer carousel being configured to move said object carriers to transfer said semiconductor objects to different processing positions; and
an object processing unit operatively associated with said object transfer carousel to process said semiconductor objects transferred to said different processing positions by said object carriers of said object transfer carousel.

24. The system of claim 23 wherein said processing unit is configured to perform a semiconductor process selected from a group consisting of polishing, wet etching, electroplating, cleaning, thickness measuring, heating, coating and treating.

25. The system of claim 23 wherein said processing unit of one of said first and second processing assemblies includes a plurality of sub-processing units to process some of said semiconductor objects.

26. The system of claim 25 wherein each of said sub-processing units is configured to perform a semiconductor process selected from a group consisting of polishing, wet etching, electroplating, cleaning, thickness measuring, heating, coating and treating.

27. The system of claim 25 wherein at least one of said sub-processing units is configured to process one of said semiconductor objects when that semiconductor object is placed on that sub-processing unit with the surface to be process facing away from that sub-processing unit.

28. The system of claim 23 further comprising an object processing station operatively associated with said object transfer device to process said semiconductor objects placed on said object processing station.

29. The system of claim 28 wherein said object processing station is configured to process two or more of said semiconductor objects in parallel.

30. The system of claim 28 wherein said object processing station is configured to perform a semiconductor process selected from a group consisting of cleaning and thickness measuring.

* * * * *